(12) United States Patent
Kyono et al.

(10) Patent No.: US 8,953,656 B2
(45) Date of Patent: Feb. 10, 2015

(54) III-NITRIDE SEMICONDUCTOR LASER DEVICE AND METHOD FOR FABRICATING III-NITRIDE SEMICONDUCTOR LASER DEVICE

(75) Inventors: Takashi Kyono, Itami (JP); Shimpei Takagi, Osaka (JP); Takamichi Sumitomo, Itami (JP); Yusuke Yoshizumi, Itami (JP); Yohei Enya, Itami (JP); Masaki Ueno, Itami (JP); Katsunori Yanashima, Kanagawa (JP)

(73) Assignees: Sumitomo Electric Industries, Ltd., Osaka-shi (JP); Sony Corporation, Tokyo (JP)

( * ) Notice: Subject to any disclaimer, the term of this patent is extended or adjusted under 35 U.S.C. 154(b) by 0 days.

(21) Appl. No.: 13/354,053

(22) Filed: Jan. 19, 2012

(65) Prior Publication Data

US 2012/0269220 A1    Oct. 25, 2012

(30) Foreign Application Priority Data

Jan. 21, 2011    (JP) .................................. 2011-011117

(51) Int. Cl.
*H01S 5/00* (2006.01)
*H01S 5/343* (2006.01)
(Continued)

(52) U.S. Cl.
CPC ........... *H01S 5/34333* (2013.01); *H01S 5/3202* (2013.01); *H01S 5/0202* (2013.01); *H01S 5/1082* (2013.01); *H01S 5/2009* (2013.01)
USPC .................................................... 372/49.01

(58) Field of Classification Search
CPC . H01S 5/1082; H01S 5/34333; H01S 5/3202; H01S 5/2009; H01S 5/0202
USPC .................................................... 372/49.01
See application file for complete search history.

(56) References Cited

U.S. PATENT DOCUMENTS

2003/0030053 A1*  2/2003  Kawakami et al. ............. 257/72
2006/0262823 A1* 11/2006  Sugimoto et al. .......... 372/45.01
(Continued)

FOREIGN PATENT DOCUMENTS

| CN | 101567518 A | 10/2009 |
| CN | 101807648 A | 8/2010 |

(Continued)

OTHER PUBLICATIONS

Asamizu et al., "Demonstration of 426 nm InGaN/GaN Laser Diodes Fabricated on Free-Standing Semipolar (11-22) Gallium Nitride Substrates," Applied Physics Express, 1, pp. 091102-1-091102-3 (2008).

(Continued)

*Primary Examiner* — Julio J Maldonado
*Assistant Examiner* — Joshua King
(74) *Attorney, Agent, or Firm* — Venable LLP; Michael A. Sartori; Tamatane J. Aga

(57) ABSTRACT

A Group III nitride semiconductor laser device includes a laser structure including a support substrate with a semipolar primary surface of a hexagonal Group III nitride semiconductor, and a semiconductor region thereon, and an electrode, provided on the semiconductor region, extending in a direction of a waveguide axis in the laser device. The c-axis of the nitride semiconductor is inclined at an angle ALPHA relative to a normal axis to the semipolar surface toward the waveguide axis direction. The laser structure includes first and second fractured faces intersecting with the waveguide axis. A laser cavity of the laser device includes the first and second fractured faces extending from edges of first and second faces. The first fractured face includes a step provided at an end face of an InGaN layer of the semiconductor region and extending in a direction from one side face to the other of the laser device.

15 Claims, 13 Drawing Sheets

(51) Int. Cl.
*H01S 5/32* (2006.01)
*H01S 5/02* (2006.01)
*H01S 5/10* (2006.01)
*H01S 5/20* (2006.01)

(56) References Cited

U.S. PATENT DOCUMENTS

| | | | |
|---|---|---|---|
| 2008/0056319 A1* | 3/2008 | Ohno | 372/43.01 |
| 2009/0052489 A1* | 2/2009 | Nomura | 372/49.01 |
| 2009/0262771 A1* | 10/2009 | Inoue et al. | 372/45.01 |
| 2010/0322276 A1* | 12/2010 | Yoshizumi et al. | 372/44.011 |

FOREIGN PATENT DOCUMENTS

| | | |
|---|---|---|
| JP | H07-86687 A | 3/1995 |
| JP | 2001-298243 A | 10/2001 |
| JP | 2002-368343 | 12/2002 |
| JP | 2006-128661 A | 5/2006 |
| JP | 2008-300584 | 12/2008 |
| JP | 2009-184836 A | 8/2009 |
| JP | 2009-194150 | 8/2009 |
| JP | 2009-224602 A | 10/2009 |
| JP | 2009-277724 A | 11/2009 |
| JP | 4475357 | 3/2010 |
| JP | 2010-093128 A | 4/2010 |
| JP | 2010-114418 | 5/2010 |
| WO | WO-2010/146723 A1 | 12/2010 |

OTHER PUBLICATIONS

Tyagi et al., "AlGaN-Cladding Free Green Semipolar GaN Based Laser Diode with a Lasing Wavelength of 506.4 nm," Applied Physics Express, 3, pp. 011002-1-011002-3 (2010).

Hsu et al., "InGaN/GaN Blue Laser Diode Grown on Semipolar (30-31) Free-Standing GaN Substrates," Applied Physics Express, 3, pp. 052702-1-052702-3 (2010).

International Preliminary Report on Patentability and Written Opinion in International Application No. PCT/JP2012/051127 dated Aug. 1, 2013.

Notice of Reasons for Rejection issued in Japanese Patent Application No. 2012-051761 dated Aug. 5, 2014.

Notification of First Office Action in Chinese Patent Application No. 201280005963.X, dated Oct. 24, 2014.

* cited by examiner

Fig.2
(a)
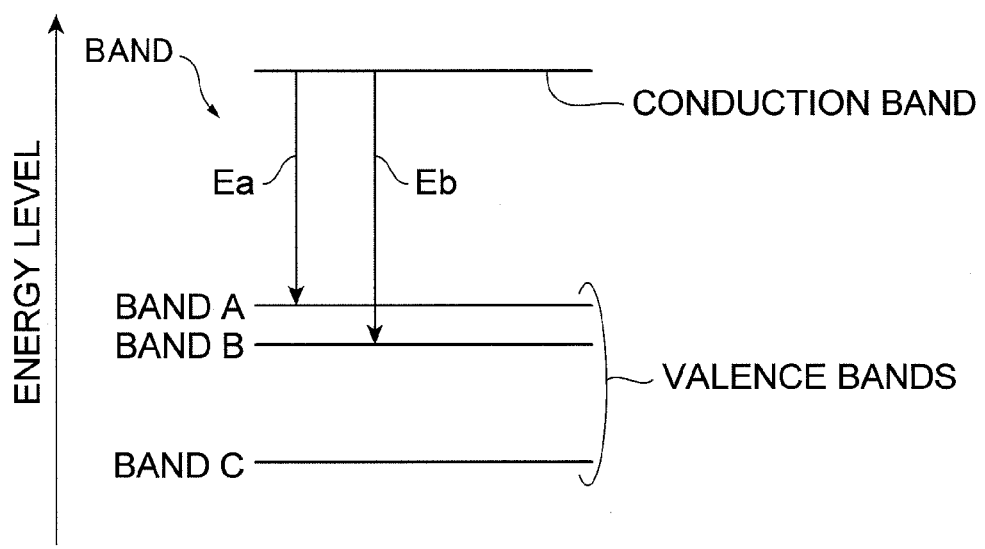
(b)
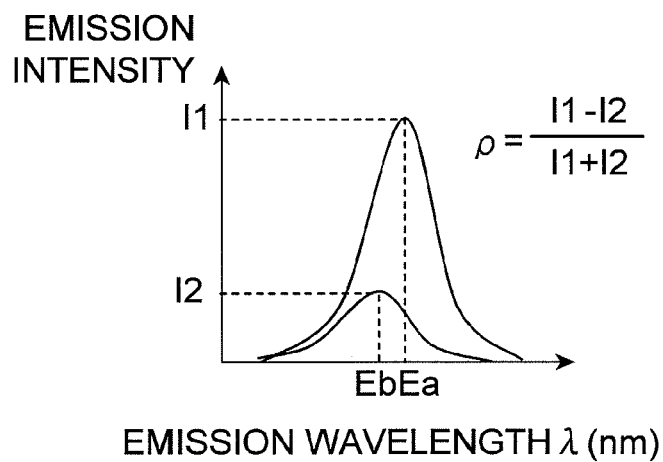

Fig.7
(a)
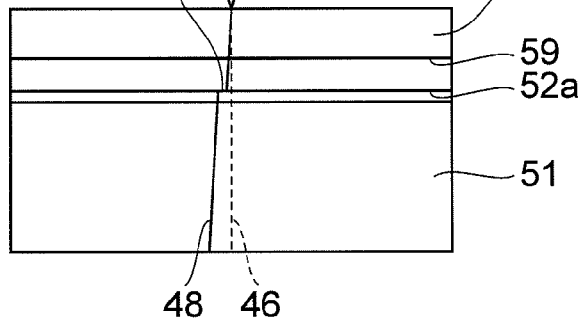
(b)
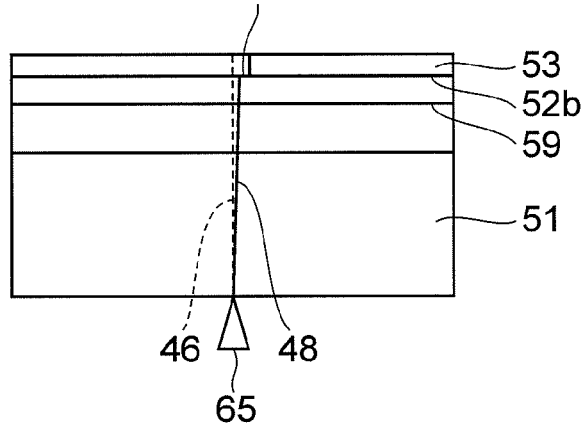
(c)
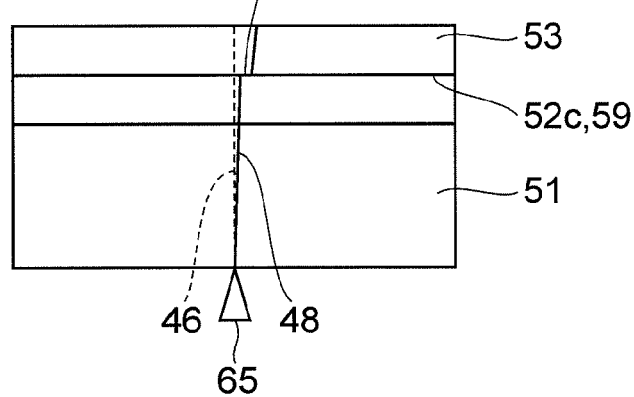

Fig.8
(a)
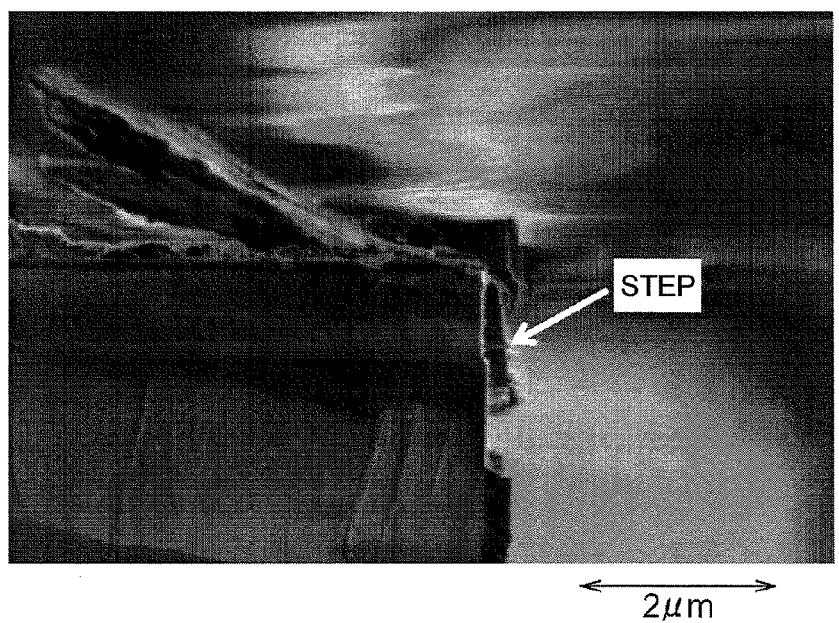
STEP
2μm
(b)
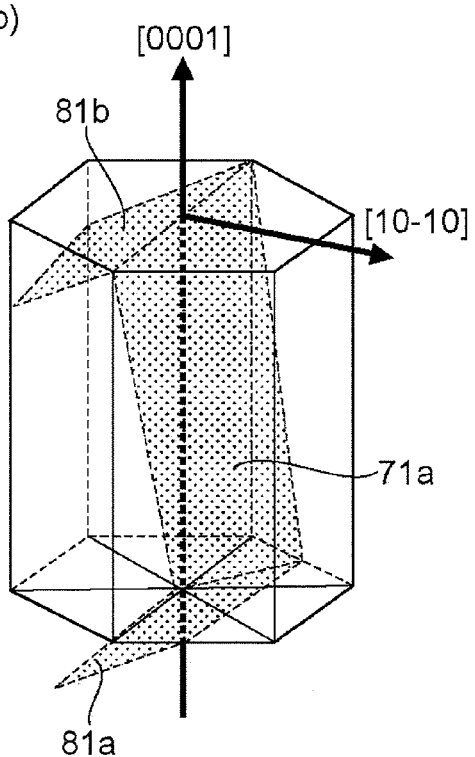
(c)
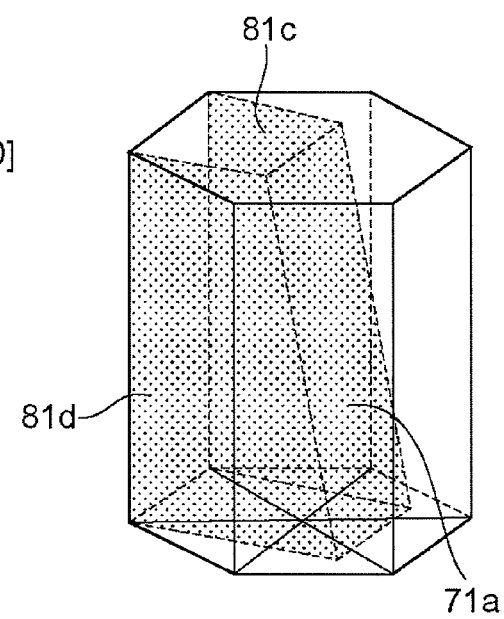

Fig.9
(a)
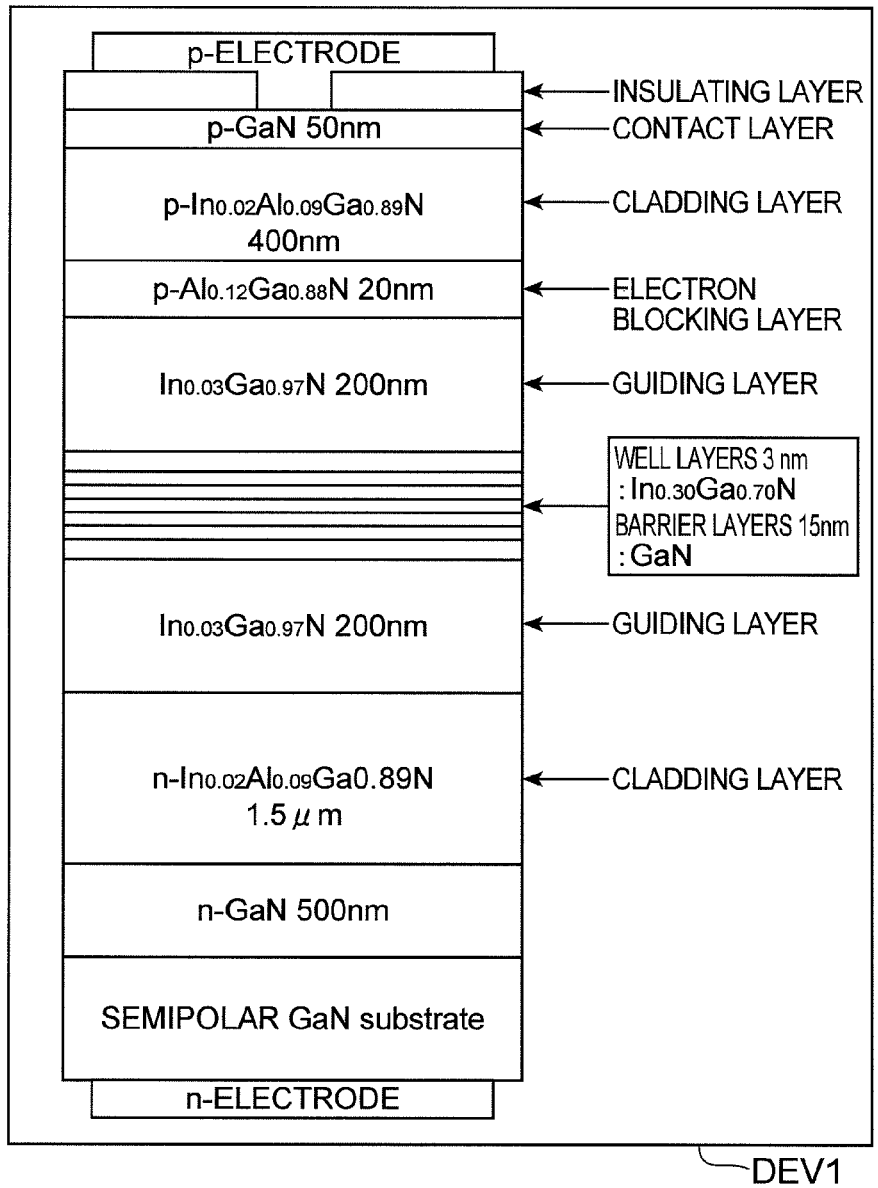
(b)
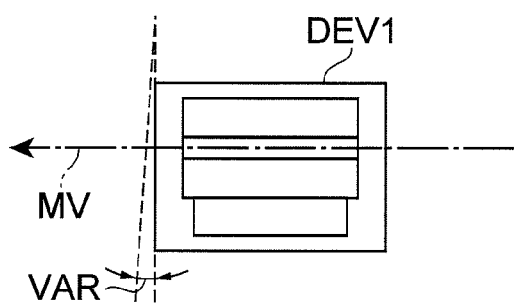

III-NITRIDE SEMICONDUCTOR LASER DEVICE AND METHOD FOR FABRICATING III-NITRIDE SEMICONDUCTOR LASER DEVICE

BACKGROUND OF THE INVENTION

1. Field of the Invention

The present invention relates to a Group III nitride semiconductor laser device, and a method for fabricating the Group III nitride semiconductor laser device.

2. Related Background Art

Patent Literature 1 describes a nitride semiconductor laser. In this nitride semiconductor laser, an active layer is formed on a (11-22) plane. (1-100) planes perpendicular to the (11-22) plane are used as end faces of a cavity to prevent reduction of luminous efficiency due to piezoelectric polarization and also to facilitate fabrication of the laser cavity. This configuration allows the fabrication of the semiconductor laser of a low threshold current with an excellent yield.

Non Patent Literature 1 describes a laser diode. This laser is fabricated on a (11-22) plane of GaN with the off-axis angle of 58 degrees, and the end faces of the cavity are formed by dry etching (RIE). Non Patent Literature 2 describes a laser diode. This laser is fabricated on a (20-21) plane of GaN with the off-axis angle of 75 degrees, and the end faces of the cavity are formed by dry etching (RIE). Non Patent Literature 3 describes a laser diode. This laser is fabricated on a (30-31) plane of GaN with the off-axis angle of 80 degrees, and the end faces of the cavity are formed by dry etching (RIE).

Patent Literature 1: Japanese Patent Application Laid-open No. 2006-128661
Patent Literature 2: Japanese Patent No. 4475357
Non Patent Literature 1: Hirokuni Asamizu, Makoto Saito, Kenji Fujito, James S. Speck, Steven P. DenBaars, and Shuji Nakamura, "Demonstration of 426 nm InGaN/GaN Laser Diodes Fabricated on Free-Standing Semipolar (11-22) Gallium Nitride Substrates," Applied Physics Express 1 (2008) 091102
Non Patent Literature 2: Anurag Tyagi, Robert M. Farrell, Kathryn M. Kelchner, Chia-Yen Huang, Po Shan Hsu, Daniel A. Haeger, Matthew T. Hardy, Casey Holder, Kenji Fujito, Daniel A. Cohen, Hiroaki Ohta, James S. Speck, Steven P. DenBaars, and Shuji Nakamura, "AlGaN-Cladding Free Green Semipolar GaN Based Laser Diode with a Lasing Wavelength of 506.4 nm," Applied Physics Express 3 (2010) 011002
Non Patent Literature 3: "InGaN/GaN Blue Laser Diode Grown on Semipolar (30-31) Free-Standing GaN Substrates," Po Shan Hsu, Kathryn M. Kelchner, Anurag Tyagi, Robert M. Farrell, Daniel A. Haeger, Kenji Fujito, Hiroaki Ohta, Steven P. DenBaars, James S. Speck, and Shuji Nakamura, Applied Physics Express 3 (2010) 052702

SUMMARY OF THE INVENTION

In Non Patent Literatures 1-3, end faces for the optical cavity are formed by use of dry etching (RIE). For this reason, they cannot avoid the formation of damages due to the application of dry etching to the end faces. Patent Literature 1 describes that cleaved facets are used as the end faces for the optical cavity. For this reason, a laser stripe needs to be oriented in accordance with cleaving directions and thus there are restrictions on selection of the extending direction of the laser stripe.

In the semiconductor lasers that the inventors have researched, the laser waveguide extends in a direction different from cleavable crystal axes. In these semiconductor lasers, therefore, cleaved facets cannot be used as end faces for the optical cavity. Inventors' attempts have demonstrated the fabrication of a semiconductor laser with a laser waveguide, which extends in a direction different from the cleavable crystal axes, without use of dry-etched facets as end faces for the optical cavity (Patent Literature 2). Since these end faces are not cleaved facets, they need to be provided with better linearity at the edges of the end faces. This improves the lasing yield.

It is an object of the present invention to provide a Group III nitride semiconductor laser device with a structure achieving an improvement in lasing yield, and it is another object of the present invention to provide a method for fabricating the Group III nitride semiconductor laser device achieving the improvement in lasing yield.

A Group III nitride semiconductor laser device according to an aspect of the present invention comprises: (a) a laser structure including a support substrate with a semipolar primary surface of a hexagonal Group III nitride semiconductor, and a semiconductor region provided on the semipolar primary surface of the support substrate; and (b) an electrode extending in a direction of a waveguide axis indicative of a direction of a waveguide in the Group III nitride semiconductor laser device and provided on the semiconductor region. The semiconductor region has a first gallium nitride based semiconductor layer, a second gallium nitride based semiconductor layer, and an active layer which are arranged along an axis normal to the semipolar primary surface; the first gallium nitride based semiconductor layer has a first conductivity type; the second gallium nitride based semiconductor layer has a second conductivity type; the c-axis of the hexagonal Group III nitride semiconductor of the support substrate is inclined at an angle ALPHA relative to the normal axis toward the direction of the waveguide axis; the laser structure includes first and second fractured faces intersecting with the waveguide axis; a laser cavity of the Group III nitride semiconductor laser device includes the first and second fractured faces; the support substrate and an the semiconductor region reaches each of the first and second fractured faces to form the respective end faces; the laser structure includes first and second faces and the first face is opposite to the second face; each of the first and second fractured faces extends from an edge of the first face to an edge of the second face; the semiconductor region includes an InGaN layer; the first fractured face includes a step provided at an end face of the InGaN layer; and the step extends in a direction from one side face to the other side face of the Group III nitride semiconductor laser device.

In this Group III nitride semiconductor laser device, the step is provided at the end face of the InGaN layer of the semiconductor region, in the fractured face different from cleaved facets. This step is formed during production of the fractured face, and extends in the direction from one side face to the other side face of the Group III nitride semiconductor laser device. This step serves to prevent an extending direction of the fractured face from largely deviating from an ideal direction, and guides an extending direction of the InGaN layer. A distribution of perpendicularity required of the fractured face as an optical cavity is made smaller by this step in fabrication of many Group III nitride semiconductor laser devices.

In the Group III nitride semiconductor laser device according to the first aspect of the present invention, a width of the step is preferably not more than 180 nm. In this Group III nitride semiconductor laser device, a too large step width leads to an increase in reflection due to the step.

In the Group III nitride semiconductor laser device according to the first aspect of the present invention, the angle between the normal axis and the c-axis of the hexagonal Group III nitride semiconductor is preferably in the range of not less than 45 degrees and not more than 80 degrees or in the range of not less than 100 degrees and not more than 135 degrees. In this Group III nitride semiconductor laser device, when the angle is less than 45 degrees or more than 135 degrees, end faces formed by press become highly likely to be comprised of m-planes or a-planes. When the angle is more than 80 degrees and less than 100 degrees, there is a possibility of failure in achievement of desired flatness and perpendicularity.

In the Group III nitride semiconductor laser device according to the first aspect of the present invention, preferably, the c-axis of the Group III nitride semiconductor is perpendicular to a reference axis in a first plane defined by both of the normal axis and the waveguide axis, and an angle between an end face for output of light (except for the step) in the semiconductor region and a reference plane perpendicular to the reference axis is an angle in the range of not less than (ALPHA−5) degrees and not more than (ALPHA+5) degrees in the first plane.

This Group III nitride semiconductor laser device has the end face satisfying the foregoing perpendicularity as to the angle defined in the first plane.

In the Group III nitride semiconductor laser device according to the first aspect of the present invention, the c-axis of the Group III nitride semiconductor is perpendicular to the reference axis in the first plane defined by the normal axis and the waveguide axis. The angle between the end face for output of light in the semiconductor region (except for the step) and the reference plane perpendicular to the reference axis can be in the range of not less than −5 degrees and not more than +5 degrees in a second plane perpendicular to both of the first plane and the normal axis.

This Group III nitride semiconductor laser device has the end face satisfying the foregoing perpendicularity as to the angle defined in the plane perpendicular to the normal axis to the semipolar surface.

In the Group III nitride semiconductor laser device according to the first aspect of the present invention, the InGaN layer preferably includes strain incorporated therein. In this Group III nitride semiconductor laser device, the InGaN layer with the built-in strain is suitable for defining the position of the step.

In the Group III nitride semiconductor laser device according to the first aspect of the present invention, an indium composition of the InGaN layer can be not less than 0.10. In this Group III nitride semiconductor laser device, when the indium composition is not less than 0.10, the built-in strain in the InGaN layer can be made larger, which is suitable for creation of the step.

In the Group III nitride semiconductor laser device according to the first aspect of the present invention, the indium composition of the InGaN layer can be not more than 0.50. In this Group III nitride semiconductor laser device, when the indium composition is over 0.50, the crystallinity of the InGaN layer degrades.

In the Group III nitride semiconductor laser device according to the first aspect of the present invention, a thickness of the InGaN layer is preferably not less than 1 nm. In this Group III nitride semiconductor laser device, when the thickness of the InGaN layer is not less than 1 nm, the built-in strain can be made larger, which is suitable for formation of the step.

In the Group III nitride semiconductor laser device according to the first aspect of the present invention, the thickness of the InGaN layer is preferably not more than 10 nm. In this Group III nitride semiconductor laser device, when the thickness of the InGaN layer is over 10 nm, there is a possibility that it is not easy to reproducibly form InGaN of high crystal quality.

The Group III nitride semiconductor laser device according to the first aspect of the present invention can further comprise a dielectric multilayer film provided on the first fractured face. The width of the step is preferably not more than 80 nm. In this Group III nitride semiconductor laser device, when the width of the step is not more than 80 nm, the dielectric multilayer film is also formed in a very good shape.

In the Group III nitride semiconductor laser device according to the first aspect of the present invention, the InGaN layer can be provided between the support substrate and the active layer. In this Group III nitride semiconductor laser device, the position of the InGaN layer can be located away from the active layer.

In the Group III nitride semiconductor laser device according to the first aspect of the present invention, the active layer can be provided between the support substrate and the InGaN layer. In this Group III nitride semiconductor laser device, the position of the InGaN layer can be located away from the active layer. The addition of the InGaN layer does not affect the crystal quality in growth of an epitaxial film between the support substrate and the active layer.

In the Group III nitride semiconductor laser device according to the first aspect of the present invention, the InGaN layer can be an InGaN well layer of the active layer. In this Group III nitride semiconductor laser device, the well layer for emission of relatively long wavelength can also serve as the InGaN layer for generation of the step.

In the Group III nitride semiconductor laser device according to the first aspect of the present invention, the c-axis of the hexagonal Group III nitride semiconductor of the support substrate can be inclined toward a direction of the m-axis of the hexagonal Group III nitride semiconductor, and the angle between the normal axis and the c-axis of the hexagonal Group III nitride semiconductor can be in the range of not less than 63 degrees and not more than 80 degrees or in the range of not less than 100 degrees and not more than 117 degrees. In this Group III nitride semiconductor laser device, a semipolar plane in this angle range is superior in indium incorporation and is suitable for formation of the InGaN layer. Furthermore, the aforementioned inclination direction is a direction suitable as to optical anisotropy.

In the Group III nitride semiconductor laser device according to the first aspect of the present invention, the semipolar primary surface can be a plane inclined off in the range of not less than −4 degrees and not more than +4 degrees from any one of a {20-21} plane, a {10-11} plane, a {20-2-1} plane, and a {10-11-1} plane. In this Group III nitride semiconductor laser device, the slightly inclined plane from these typical semipolar planes can provide the end face with flatness and perpendicularity enough to construct the laser cavity of the Group III nitride semiconductor laser device.

In the Group III nitride semiconductor laser device according to the first aspect of the present invention, the semipolar primary surface can be any one of a {20-21} plane, a {10-11} plane, a {20-2-1} plane, and a {10-1-1} plane. In this Group III nitride semiconductor laser device, these typical semipolar planes can provide the end face with flatness and perpendicularity enough to construct the laser cavity of the Group III nitride semiconductor laser device.

In the Group III nitride semiconductor laser device according to the first aspect of the present invention, the active layer can include a light emitting region provided so as to generate light at the wavelength of not less than 480 nm. In this Group III nitride semiconductor laser device, the long-wavelength emission at the wavelength of not less than 480 nm can be suitably realized in the Group III nitride semiconductor laser device using the semipolar nature. In the Group III nitride semiconductor laser device according to the first aspect of the present invention, the active layer can include a light emitting region provided so as to emit light at the wavelength of not more than 550 nm.

Another aspect of the present invention is a method for fabricating a Group III nitride semiconductor laser device. This method comprises: (a) preparing a substrate with a semipolar primary surface comprised of a hexagonal Group III nitride semiconductor; (b) forming a substrate product having a laser structure which includes the substrate and a semiconductor region formed on the semipolar primary surface, a first electrode, and a second electrode; (c) scribing the substrate product in a direction perpendicular to a direction of projection of the c-axis of the hexagonal Group III nitride semiconductor onto the semipolar primary surface; and (d) breaking the substrate product by press on the substrate product to form another substrate product and a laser bar. The semiconductor region has a first gallium nitride based semiconductor layer, an active layer, and a second gallium nitride based semiconductor layer which are arranged along a normal axis to the semipolar primary surface; the first gallium nitride based semiconductor layer exhibits a first conductivity type; the second gallium nitride based semiconductor layer exhibits a second conductivity type; the c-axis of the hexagonal Group III nitride semiconductor of the substrate is inclined at an angle ALPHA relative to the normal axis to the semipolar primary surface toward a direction of a waveguide axis indicative of a direction of a waveguide in the Group III nitride semiconductor laser device; the first electrode extends in the direction of the waveguide axis on the laser structure; the laser bar has first and second end faces formed by the breaking; the waveguide axis is oriented in a direction from the first end face to the second end face; the laser structure includes first and second faces and the first face is opposite to the second face; the semiconductor region is located between the first face and the substrate; the first and second end faces are provided for a laser cavity of the Group III nitride semiconductor laser device; the semiconductor region includes an InGaN layer; the first end face includes a step provided at an end face of the InGaN layer; and the step extends in a direction intersecting with the waveguide axis and the normal axis.

According to this fabricating method, the semiconductor region includes the InGaN layer and the laser bar with the first and second end faces is formed by breaking. The InGaN layer is formed in the semiconductor region, and the step is formed at the end face of this InGaN layer, during production of the end face by breaking. This step extends in the direction from one side face to the other side face of the Group III nitride semiconductor laser device. The generating direction of the end face is guided by extension of this step and a distribution range of perpendicularity required of the end face as an optical cavity can be made smaller during production of many Group III nitride semiconductor laser devices.

In the fabricating method according to the second aspect of the present invention, the angle ALPHA can be in the range of not less than 45 degrees and not more than 80 degrees or in the range of not less than 100 degrees and not more than 135 degrees. According to this fabricating method, when the angle is less than 45 degrees or more than 135 degrees, the end faces formed by press become highly likely to be comprised of m-planes or a-planes. When the angle is more than 80 degrees and less than 100 degrees, there is a possibility of failure in achievement of desired flatness and perpendicularity.

In the fabricating method according to the second aspect of the present invention, preferably, a thickness of the InGaN layer is in the range of not less than 1 nm and not more than 10 nm, the InGaN layer is provided between the substrate and the active layer, scribing the substrate product comprises scribing a second face of the substrate product, and forming the other substrate product and the laser bar comprises performing press against a first face of the substrate product.

According to this fabricating method, when the second face (back surface of the substrate) is scribed and the first face (epitaxial surface) is pressed, the step capable of guiding a direction of fracture can be formed in the InGaN layer.

In the fabricating method according to the second aspect of the present invention, preferably, the thickness of the InGaN layer is in the range of not less than 1 nm and not more than 10 nm, the InGaN layer is provided between the substrate and the active layer, scribing the substrate product comprises scribing a first face of the substrate product, and forming the other substrate product and the laser bar comprises performing press against a second face of the substrate product.

According to this fabricating method, when the first face (epitaxial surface) is scribed and the second face (back surface of the substrate) is pressed, the step capable of guiding the direction of fracture can be formed in the InGaN layer.

In the fabricating method according to the second aspect of the present invention, preferably, the thickness of the InGaN layer is in the range of not less than 1 nm and not more than 10 nm, the active layer is provided between the substrate and the InGaN layer, scribing the substrate product comprises scribing a first face of the substrate product, and forming the other substrate product and the laser bar comprises performing press against a second face of the substrate product.

According to this fabricating method, when the first face (epitaxial surface) is scribed and the second face (back surface of the substrate) is pressed, the step capable of guiding the direction of fracture can be formed in the InGaN layer.

In the fabricating method according to the second aspect of the present invention, preferably, the InGaN layer is an InGaN well layer of the active layer, scribing the substrate product comprises scribing a first face of the substrate product, and forming the other substrate product and the laser bar comprises performing press against a second face of the substrate product.

According to this fabricating method, when the first face (epitaxial surface) is scribed and the second face (back surface of the substrate) is pressed, the step capable of guiding the direction of fracture can be formed in the InGaN layer.

BRIEF DESCRIPTION OF THE DRAWINGS

The above objects and the other objects, features, and advantages of the present invention will more readily become clear from the following detailed description of the preferred embodiments of the present invention proceeding with reference to the accompanying drawings.

FIG. 2 is a drawing showing a band structure in an active layer in the Group III nitride semiconductor laser device.

FIG. 7 is a drawing showing examples about the position of an InGaN layer.

FIG. 8 is a drawing showing a scanning electron microscope image of an end face of an optical cavity, along with {20-21} planes in crystal lattices.

FIG. 9 is a drawing showing a device structure and an epitaxial structure in Example 1.

DETAILED DESCRIPTION OF THE PREFERRED EMBODIMENTS

The expertise of the present invention can be readily understood in view of the following detailed description with reference to the accompanying drawings provided by way of illustration only.

The below will describe embodiments of a Group III nitride semiconductor laser device and a method of fabricating the Group III nitride semiconductor laser device according to the present invention, with reference to the accompanying drawings. The same portions will be denoted by the same reference signs as much as possible.

Figure 1:
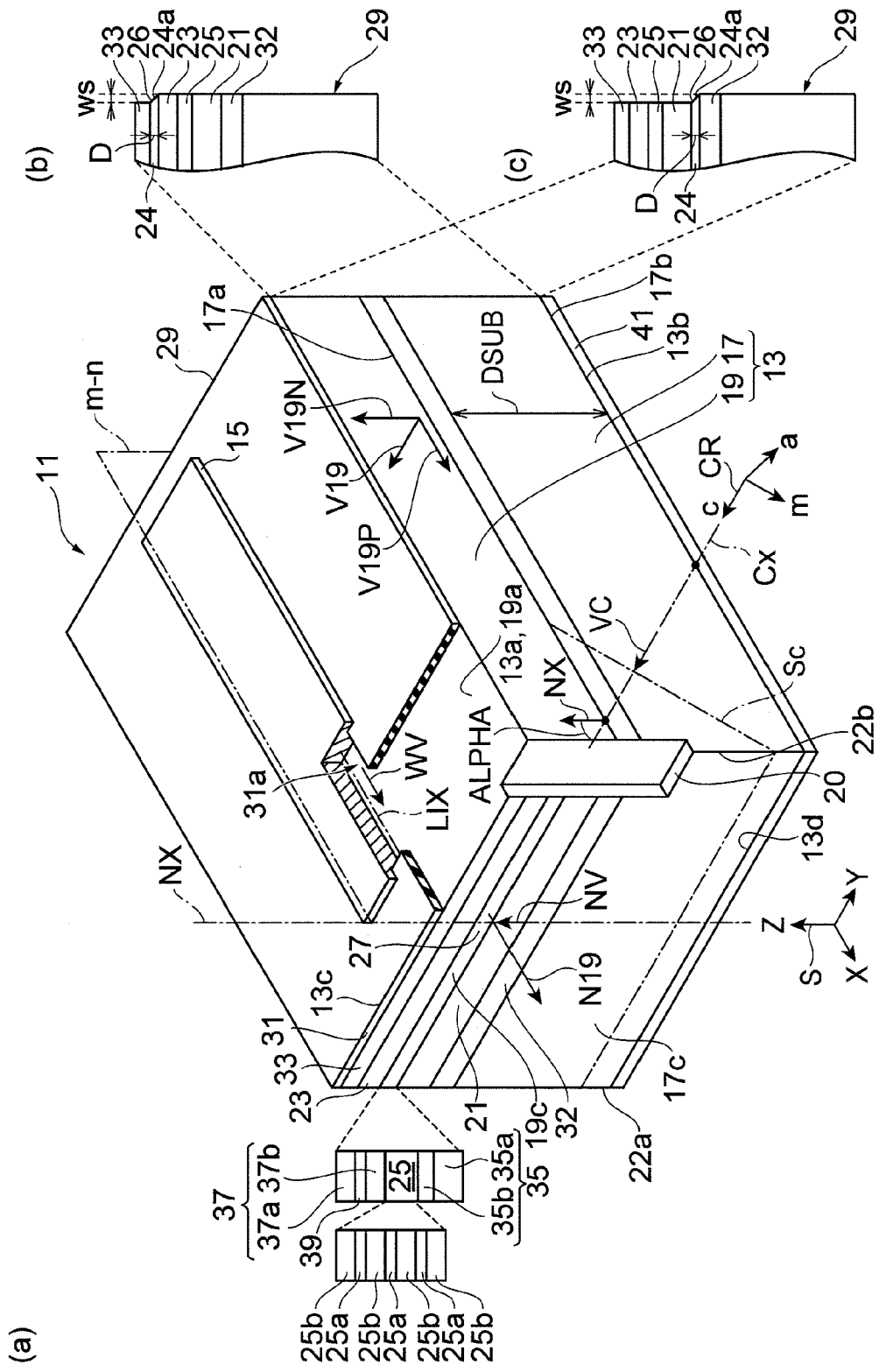
FIG. 1 is a drawing schematically showing a structure of a Group III nitride semiconductor laser device according to an embodiment of the present invention.

FIG. 1 is a drawing schematically showing a structure of the Group III nitride semiconductor laser device according to an embodiment of the present invention. The Group III nitride semiconductor laser device 11 has a gain-guiding type structure, but embodiments of the present invention are not limited to gain-guiding type structures. The Group III nitride semiconductor laser device 11 includes a laser structure 13 and an electrode 15. The laser structure 13 includes a support substrate 17 and an epitaxial semiconductor region 19 (which will be referred to as "semiconductor region 19"). The support substrate 17 has a semipolar primary surface 17a and a back surface 17b comprising a hexagonal gallium nitride semiconductor. The semiconductor region 19 is provided on the semipolar primary surface 17a of the support substrate 17. The electrode 15 is provided on the semiconductor region 19 of the laser structure 13, and extends in a direction of a waveguide axis (waveguide vector WV) indicative of a direction of the waveguide in the Group III nitride semiconductor laser device 11. The semiconductor region 19 includes a first cladding layer 21, a second cladding layer 23, and an active layer 25. The first cladding layer 21 includes a first conductivity type Group III nitride semiconductor layer and comprises a gallium nitride semiconductor layer, such as, n-type AlGaN, n-type InAlGaN, or the like. The second cladding layer 23 includes a second conductivity type Group III nitride semiconductor layer and comprises a gallium nitride semiconductor layer, such as, p-type AlGaN, p-type InAlGaN, or the like. The active layer 25 is disposed between the first cladding layer 21 and the second cladding layer 23 and includes a light emitting region. The active layer 25 includes gallium nitride semiconductor layers, and the gallium nitride semiconductor layers may be, for example, well layers 25a. The active layer 25 includes barrier layers 25b, which comprises a gallium nitride semiconductor, and the well layers 25a and barrier layers 25b are alternately arranged. The well layers 25a comprise, for example, of InGaN, InAlGaN, or the like, and the barrier layers 25b comprises, for example, GaN, InGaN, InAlGaN, or the like. The active layers 25 can include a quantum well structure. In examples, the lasing wavelength of the active layer 25 can be, for example, the wavelength of not less than 480 nm and can be not more than 550 nm, but the lasing wavelength does not have to be limited to it. Use of a semipolar plane of gallium nitride semiconductor film 18 is suitable for growth of an InGaN layer, which enables emission of long wavelength. The first cladding layer 21, the second cladding layer 23, and the active layer 25 are arranged along a normal axis NX to the semipolar primary surface 17a. The semiconductor region 19 can include a buffer layer 32 and a contact layer 33. The laser structure 13 includes a first fractured face 27 and a second fractured face 29, which extend in a direction intersecting with the waveguide axis. For example, these fractured faces 27, 29 extend from an edge of a primary surface 19a of the semiconductor region 19 of the laser structure 13 to the back surface of the support substrate 17 of the laser structure 13. The first and second fractured faces 27, 29 are different from cleaved facets. In the operation of the Group III nitride semiconductor laser device 11, the fractured faces 27, 29 are associated with reflection of light and transmission of light.

An end face 17c of the support substrate 17 and an end face 19c of the semiconductor region 19 are exposed in each of the first and second fractured faces 27, 29. The laser structure 13 includes first and second faces 13a, 13b, and the first face 13a is a face opposite to the second face 13b. Each of the first and second fractured faces 27, 29 extends from an edge of the first face 13a to an edge of the second face 13b. The semiconductor region 19 includes an InGaN layer 24. Parts (b) and (c) of FIG. 1 are side views showing a region near the fractured face 29, and the fractured face 27 can also have the same structure as the fractured face 29. The semiconductor region 19 can include the InGaN layer 24. The fractured face 29 includes a step 26 provided at an end face 24a of the InGaN layer 24. The difference in level 26 extends in a direction from one side face 22a to the other side face 22b of the Group III nitride semiconductor laser device 11. The step 26 can be formed in part or in whole of the end face 24a of the InGaN layer 24 in the fractured faces 27, 29. In the example shown in part (b) of FIG. 1, the InGaN layer 24 is provided between the second cladding layer 23 and active layer 25 and an insulating film 31 and, more specifically, it is disposed between the second cladding layer 23 and the contact layer 33. In the example shown in part (c) of FIG. 1, the InGaN layer 24 is provided between the active layer 25 and first cladding layer 21 and the support substrate 17 and, more specifically, it is disposed between the first cladding layer 21 and the buffer layer 32.

In this Group III nitride semiconductor laser device 11, each of the fractured faces 27, 29 different from cleaved facets is provided with the step 26 at the end face 24a of the InGaN layer 24 in the semiconductor region 19. This step 26 is formed during production of the fractured faces 27, 29 and may extends in the direction from one side face 22a to the other side face 22b of the Group III nitride semiconductor laser device 11. This step 26 serves to guide the extending direction of the fractured faces 27, 29. In fabrication of many Group III nitride semiconductor laser devices 11, this step 26 makes it possible to narrow the distribution range of perpendicularity required of the fractured faces 27, 29 for an optical cavity.

The width WS of the step 26 is preferably not more than 180 nm. In this Group III nitride semiconductor laser device, a too large width of the step will lead to an increase in diffuse reflection caused by the step 26. According to preliminary estimation, when the lasing wavelength is 480 nm, the effective wavelength (based on estimation with the refractive index of 2.54) in the gallium nitride semiconductor is approximately 189 nm. When the lasing wavelength is 550 nm, the effective wavelength in the gallium nitride semiconductor is approximately 217 nm. When the width of the step 26 is smaller than the effective wavelength in the gallium nitride semiconductor, the light passing through the fractured face is not effectively affected by the step 26 serving as a change of refractive index. When the lasing wavelength range is from blue to green, the width of the step 26 is preferably not more than 180 nm.

In the Group III nitride semiconductor laser device 11, the InGaN layer 24 preferably incorporates strain. The inclusion of the built-in strain into the InGaN layer 24 is suitable for formation of the step 26 and use of InGaN with the built-in strain is suitable for defining the position of the step 26.

An indium composition of the InGaN layer 24 can be not less than 0.10. When this indium composition is not less than 0.10, the InGaN layer 24 can include large incorporated strain, which is suitable for generation of the step 26. Furthermore, the indium composition of the InGaN layer 24 can be not more than 0.50. When this indium composition exceeds 0.50, the crystallinity of the InGaN layer degrades.

The thickness D of the InGaN layer 24 is defined in the direction of the normal axis NX and is preferably not less than 1 nm. In this case, the InGaN layer 24 can include large built-in strain, which can reduce the occurrence of the step 26. The thickness D of the InGaN layer 24 is preferably not more than 10 nm. When this thickness D exceeds 10 nm, it is not easy to deposit InGaN of excellent crystal quality reproducibly.

As described previously, when the InGaN layer 24 is disposed between the support substrate 17 and the active layer 25, the position of the InGaN layer 24 can be located away from the active layer 25. Furthermore, when the active layer 25 is disposed between the support substrate 17 and the InGaN layer 24, the position of the InGaN layer 24 can be located away from the active layer 25. The addition of the InGaN layer 24 does not affect the crystal quality in growth of an epitaxial film such as the active layer 25 which is grown on the support substrate 17. Furthermore, the InGaN layer 24 can be an InGaN well layer of the active layer 25. In this case, the well layer for emission of relatively long wavelength can also serve as the InGaN layer for generation of the step 26.

With reference to FIG. 1, there are an orthogonal coordinate system S and a crystal coordinate system CR illustrated. The normal axis NX is directed in the direction of the Z-axis of the orthogonal coordinate system S. The semipolar primary surface 17a extends in parallel with a predetermined plane defined by the X-axis and Y-axis of the orthogonal coordinate system S. In FIG. 1, a typical c-plane Sc in the support substrate 17 is depicted. Furthermore, a vector VC indicates the direction of the c-axis of the support substrate 17. In an example, the c-axis of the support substrate 17 (and the c-axis of the Group III nitride semiconductor in the semiconductor region 19) is inclined at an angle ALPHA of more than zero, relative to the normal axis NX toward the direction of the waveguide axis. In an example, the c-axis of the support substrate 17 is inclined toward the direction of the m-axis. In the Group III nitride semiconductor laser device 11, the laser structure 13 includes the fractured faces 27, 29 which intersect with an m-n plane defined by the m-axis of the support substrate 17 and the normal axis NX.

The Group III nitride semiconductor laser device 11 further comprises the insulating film 31. The insulating film 31 covers the surface 19a of the semiconductor region 19 of the laser structure 13, and the semiconductor region 19 is located between the insulating film 31 and the support substrate 17. The insulating film 31 has an aperture 31a, and the aperture 31a extends in the direction indicated by the waveguide vector WV. In the present example, the aperture 31a extends in a direction of an intersecting line LIX between the surface 19a of the semiconductor region 19 and the aforementioned m-n plane and is formed, for example, in a stripe shape. The electrode 15 is in contact with the surface 19a of the semiconductor region 19 (e.g., the second conductivity type contact layer 33) through the aperture 31a, and extends in the direction of the aforementioned intersecting line LIX. In the Group III nitride semiconductor laser device 11, the laser waveguide includes the first cladding layer 21, the second cladding layer 23, and the active layer 25 and extends in the direction of the aforementioned intersecting line LIX.

In the Group III nitride semiconductor laser device 11, the first fractured face 27 and the second fractured face 29 intersect with a reference plane defined by the waveguide axis (waveguide vector WV) and the normal axis NX. In the present example, the first fractured face 27 and the second fractured face 29 intersect with the m-n plane defined by the m-axis of the hexagonal Group III nitride semiconductor and the normal axis NX. The laser cavity of the Group III nitride semiconductor laser device 11 includes the first and second fractured faces 27 and 29, and the laser waveguide extends from one to the other of the first and second fractured faces 27 and 29. The laser structure 13 includes the first face 13a and the second face 13b, and the first face 13a is opposite to the second face 13b. The first and second fractured faces 27, 29 extend from an edge 13c of the first face 13a to an edge 13d of the second face 13b. Each of the first and second fractured faces 27 and 29 includes an end face 19c of the semiconductor region 19 and an end face 17c of the support substrate 17. The end face 19c of the semiconductor region 19 is different from the cleaved facets (the conventional cleaved facets such as c-planes, m-planes, or a-planes) in the present example.

In the Group III nitride semiconductor laser device 11, as shown in FIG. 1, at least one of the fractured faces 27, 29 can include a scribed part 20. In the present example, the scribed part 20 ranges from the primary surface 19a (first face 13a) of the semiconductor region 19 into the support substrate 17 in one side face 22b and another scribed part 20 of the same shape can be provided in the other side face 22a. In another example, the scribed impression can extend from the back surface 17b of the support substrate 17 in the direction from the second face 13b to the first face 13a in at least one of the side faces 22a, 22b. The scribed part 20 defines the extending direction of the fractured face.

In this Group III nitride semiconductor laser device 11, the first and second fractured faces 27, 29 that form the laser cavity intersect with the m-n plane. For this reason, the laser waveguide can be provided so as to extend in the direction of the intersecting line between the m-n plane and the semipolar surface 17a. Hence, the Group III nitride semiconductor laser device 11 has the laser cavity that enables a low threshold current.

The Group III nitride semiconductor laser device 11 includes an n-side optical guiding layer 35 and a p-side optical guiding layer 37. The n-side optical guiding layer 35 includes a first portion 35a and a second portion 35b, and the n-side optical guiding layer 35 is comprised, for example, of GaN, InGaN, or the like. The p-side optical guiding layer 37 includes a first portion 37a and a second portion 37b, and the p-side optical guiding layer 37 comprises, for example, GaN, InGaN, or the like. A carrier blocking layer 39 is provided, for example, between the first portion 37a and the second portion 37b. Another electrode 41 is provided on the back surface 17b of the support substrate 17 and the electrode 41 is provided, for example, on the back surface 17b of the support substrate 17.

Figure 3:
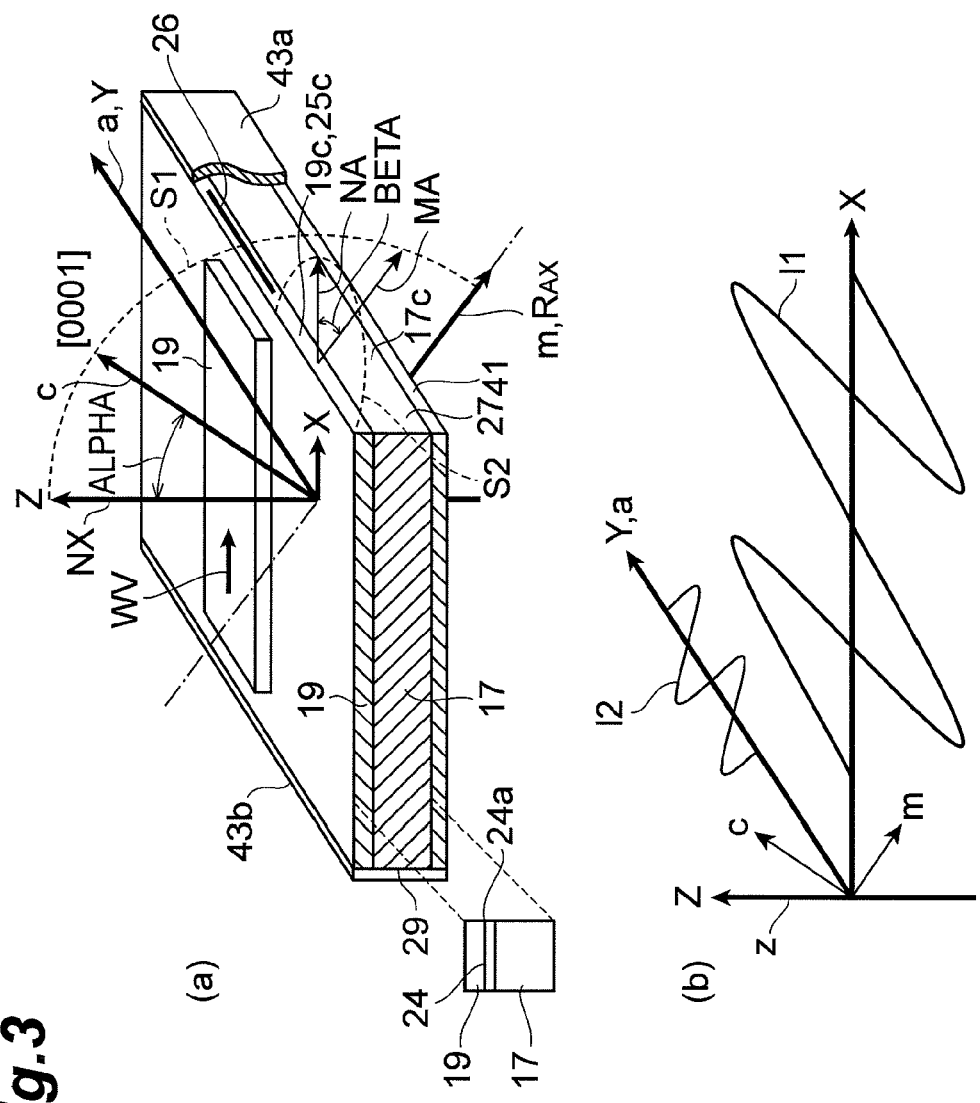
FIG. 3 is a drawing showing polarization of emission from the active layer of the Group III nitride semiconductor laser device.
Figure 4:
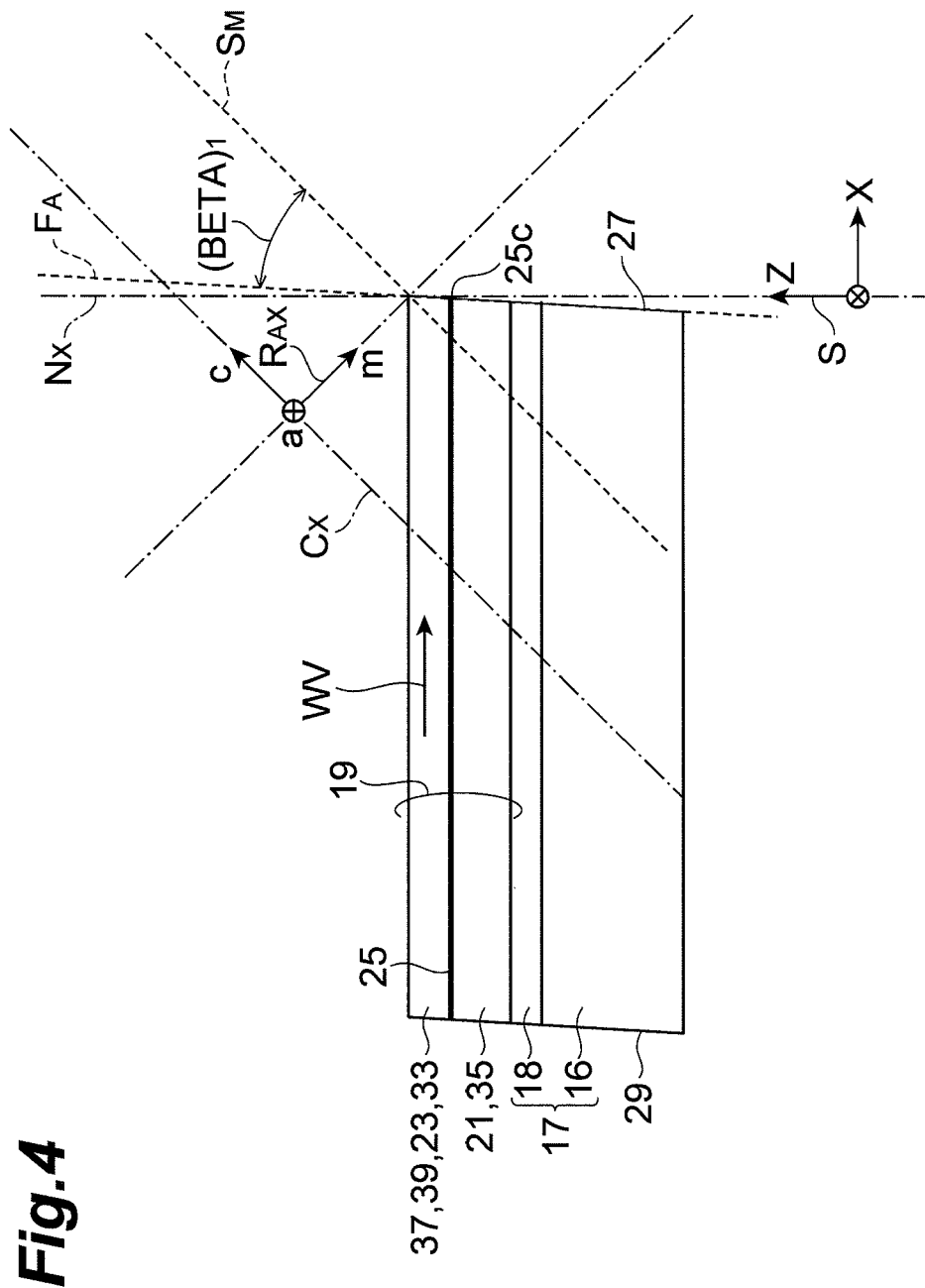
FIG. 4 is a drawing showing a relation between an end face of the Group III nitride semiconductor laser device and an m-plane of the active layer.

FIG. 2 is a drawing showing a band structure in the active layer in the Group III nitride semiconductor laser device. FIG. 3 is a drawing showing polarization of emission in the active layer 25 of the Group III nitride semiconductor laser device 11. FIG. 4 is a drawing schematically showing a cross section defined by the c-axis and m-axis. With reference to part (a) of FIG. 2, there are three possible transitions between a conduction band and valence bands, around the Γ point of the band structure BAND. The band A and the band B have a relatively small energy difference. The light produced by transition Ea between the conduction band and the band A is polarized in the a-axis direction, and the light produced by transition Eb between the conduction band and the band B is polarized in a direction of the projected c-axis onto the primary surface. Concerning lasing, the threshold of transition Ea is smaller than that of transition Eb.

With reference to part (b) of FIG. 2, there are shown spectra of light in the LED mode in the Group III nitride semiconductor laser device 11. The light in the LED mode includes a polarization component I1 in the direction of the a-axis of the hexagonal Group III nitride semiconductor and a polarization component I2 in the direction of projection of the c-axis of the hexagonal Group III nitride semiconductor onto the primary surface, and the polarization component I1 is larger than the polarization component I2. The degree of polarization ρ is defined by (I1−I2/(I1+I2). The laser cavity of the Group III nitride semiconductor laser device 11 can be used to laser light in a mode of large emission intensity in the LED mode.

As shown in FIG. 3, the device can further comprise a dielectric multilayer film 43a, 43b which is provided on at least one or on each of the first and second fractured faces 27, 29. An end-face coat can also be applied to another of the fractured faces 27, 29. The end-face coat allows adjustment of reflectance. When the width WS of the step 26 is not more than 80 nm, the dielectric multilayer film 43a, 43b is formed in a very good shape.

As shown in part (b) of FIG. 3, laser light L from the active layer 25 is polarized in the direction of the a-axis of the hexagonal Group III nitride semiconductor. In this Group III nitride semiconductor laser device 11, band transitions enabling realization of a low threshold current have polarization. The first and second fractured faces 27, 29 for the laser cavity are different from the conventional cleaved facets such as c-planes, m-planes, or a-planes. However, the first and second fractured faces 27, 29 have flatness and perpendicularity as mirrors for the cavity. For this reason, as shown in part (b) of FIG. 3, it becomes feasible to implement lasing with a low threshold by the emission of transition Ea stronger than the emission of transition Eb, which is polarized in the direction of projection of the c-axis onto the primary surface, using the first and second fractured faces 27, 29 and the laser waveguide extending from one to the other of these fractured faces 27, 29.

In the Group III nitride semiconductor laser device 11, the end face 17c of the support substrate 17 and the end face 19c of the semiconductor region 19 are exposed in each of the first and second fractured faces 27 and 29, and the end face 17c and the end face 19c are covered with the dielectric multilayer film 43a.

As shown in FIG. 3, a first plane S1 is defined by the normal axis and the waveguide vector WV (directed in the direction of the X-axis in FIG. 3). When the c-axis is inclined toward the direction of the waveguide axis, the c-axis of the Group III nitride semiconductor of the support substrate 17 can be used instead of the normal axis, for the definition of the first plane S1. The c-axis of the Group III nitride semiconductor is perpendicular to a certain reference axis $R_{AX}$ in the first plane S1. This reference axis $R_{AX}$ is equivalent to the m-axis, for example, when the c-axis is inclined toward the m-axis. An angle between a reference plane perpendicular to this reference axis $R_{AX}$ (which is an m-plane in the above example) and an end face for output of light (e.g., the end face 25c in the active layer 25) in the semiconductor region 19 is referred to as BETA. For example, when the aforementioned c-axis is inclined toward the m-axis, the angle BETA corresponds to an angle defined between a normal vector NA to the end face 19c and the end face 25c in the active layer 25 and an m-axis vector MA of the Group III nitride semiconductor. The angle BETA is defined by a component $(BETA)_1$ defined in the first plane S1 and a component $(BETA)_2$ defined in a second plane S2 perpendicular to both of the first plane S1 and the normal axis NX. The component $(BETA)_1$ is preferably in the range of not less than (ALPHA−5) degrees and not more than (ALPHA+5) degrees in the first plane S1. This angle range is shown as an angle between a typical m-plane $S_M$ and a reference plane $F_A$ in FIG. 4. The typical m-plane $S_M$ is illustrated from inside to outside of the laser structure, in FIG. 4, for facilitating understanding. The reference plane $F_A$ extends along the end face 25c of the active layer 25. This Group III nitride semiconductor laser device 11 has the end face satisfying the aforementioned perpendicularity as to the angle BETA taken from one to the other of the c-axis and the m-axis. The component $(BETA)_2$ is preferably in the range of not less than −5 degrees and not more than +5 degrees in the second plane S2. Here, $BETA^2=(BETA)_1^2+(BETA)_2^2$. In this case, the fractured faces 27, 29 of the Group III nitride semiconductor laser device 11 satisfy the aforementioned perpendicularity as to the in-plane angle defined in the plane perpendicular to the normal axis NX to the semipolar surface 17a.

Referring again to FIG. 1, the thickness DSUB of the support substrate 17 is preferably not more than 400 μm in the Group III nitride semiconductor laser device 11. In this Group III nitride semiconductor laser device, it is suitable for obtaining the good-quality fractured faces for the laser cavity. In the Group III nitride semiconductor laser device 11, the thickness DSUB of the support substrate 17 is more preferably not less than 50 μm and not more than 100 μm. In this Group III nitride semiconductor laser device 11, it is more suitable for obtaining the good-quality fractured faces for the laser cavity. Furthermore, handling becomes easier and the production yield becomes improved.

In the Group III nitride semiconductor laser device 11, the angle ALPHA between the normal axis NX and the c-axis of the hexagonal Group III nitride semiconductor is preferably not less than 45 degrees and preferably not more than 80 degrees. Furthermore, the angle ALPHA is preferably not less than 100 degrees and preferably not more than 135 degrees. When the angle is less than 45 degrees or more than 135 degrees, the end faces formed by press are highly likely to be comprised of m-planes. When the angle is more than 80 degrees and less than 100 degrees, there is a possibility of failure in achievement of desired flatness and perpendicularity.

In the Group III nitride semiconductor laser device 11, more preferably, the angle ALPHA between the normal axis NX and the c-axis of the hexagonal Group III nitride semiconductor is not less than 63 degrees and preferably not more than 80 degrees. Furthermore, the angle ALPHA is preferably not less than 100 degrees and preferably not more than 117 degrees. In this angle range, the piezoelectric polarization can be made smaller in the active layer. Since In incorporation is large enough in growth of the active layer, a variable range of In composition becomes wide in the active layer. For this reason, the foregoing range is suitable for obtaining emission of long wavelength. Since In incorporation is large enough, the range is suitable for formation of the InGaN layer 24.

The semipolar primary surface 17a can be any one of a {20-21} plane, a {10-11} plane, a {20-2-1} plane, and a {10-1-1} plane. Furthermore, planes slightly inclined in the range of not less than −4 degrees and not more than +4 degrees from these planes are also suitably applicable to the semipolar primary surface. With these typical semipolar planes 17a, the first and second fractured faces 27, 29 can be provided with flatness and perpendicularity enough to construct the laser cavity of the Group III nitride semiconductor laser device 11. Furthermore, the end faces demonstrating the sufficient flatness and perpendicularity are obtained in the angle range over these typical plane orientations.

The support substrate 17 can be comprised of any one of GaN, AlN, AlGaN, InGaN, and InAlGaN. When the substrate used comprises one of these gallium nitride semiconductors, we can obtain the fractured faces 27, 29 applicable to the cavity.

Figure 5:
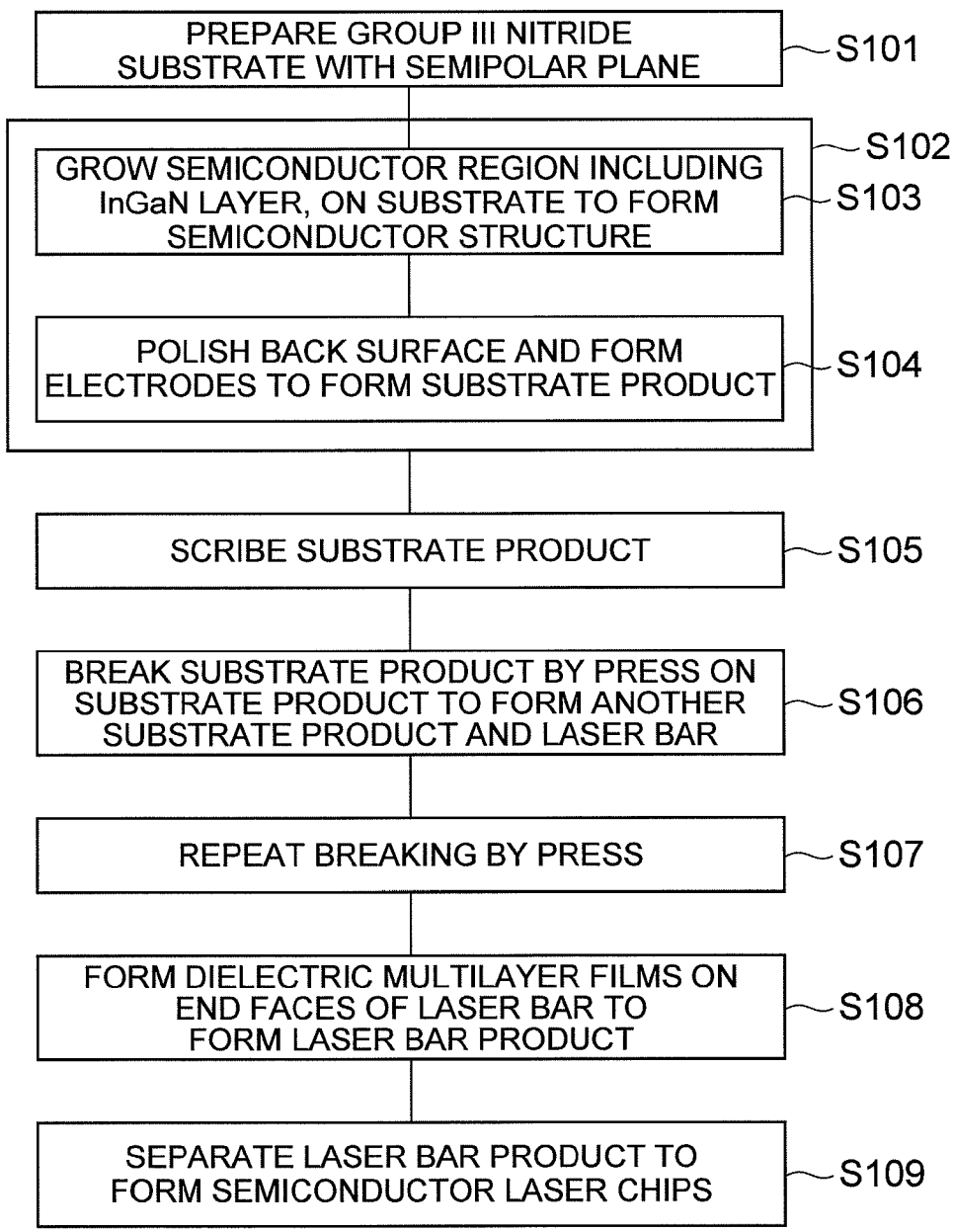
FIG. 5 is a fabrication flowchart showing major steps in a method for fabricating a Group III nitride semiconductor laser device according to an embodiment of the present invention.

FIG. 5 is a drawing showing major steps in a method for fabricating the Group III nitride semiconductor laser device according to the present embodiment. With reference to part (a) of FIG. 6, there is a substrate 51 shown. In Step S101, the substrate 51 is prepared for fabrication of the Group III nitride semiconductor laser device. The c-axis (vector VC) of a hexagonal Group III nitride semiconductor of the substrate 51 is inclined at the angle ALPHA with respect to the normal axis NX toward the m-axis direction (vector VM) of the hexagonal Group III nitride semiconductor. For this reason, the substrate 51 has a semipolar primary surface 51a, which comprises the hexagonal Group III nitride semiconductor.

In Step S102, a substrate product SP is formed. Although the substrate product SP is illustrated as the member that has an approximate disk shape in part (a) of FIG. 6, the shape of the substrate product SP is not limited to this shape. For obtaining the substrate product SP, first, a laser structure 55 is formed in Step S103. The laser structure 55 includes a semiconductor region 53 and the Group III nitride substrate 51 and in Step S103 the semiconductor region 53 is formed on the semipolar primary surface 51a. For forming the semiconductor region 53, a gallium nitride semiconductor region 57 of the first conductivity type, a light emitting layer 59, and a gallium nitride semiconductor region 61 of the second conductivity type are grown in order on the semipolar primary surface 51a. The gallium nitride semiconductor region 57 can include, for example, an n-type cladding layer, and the gallium nitride semiconductor region 61 can include, for example, a p-type cladding layer. The light emitting layer 59 is provided between the gallium nitride semiconductor region 57 and the gallium nitride semiconductor region 61, and can include an active layer, a optical guiding layer, and an electron block layer, for example. The first conductivity type gallium nitride semiconductor region 57, the light emitting layer 59, and the second conductivity type gallium nitride semiconductor region 61 are arranged along the axis NX normal to the semipolar primary surface 51a. These semiconductor layers are epitaxially grown thereon. The area of the semiconductor region 53 is covered with an insulating film 54. The insulating film 54 comprises, for example, silicon oxide. The insulating film 54 has an aperture 54a. The aperture 54a has, for example, a stripe shape.

Figure 6:
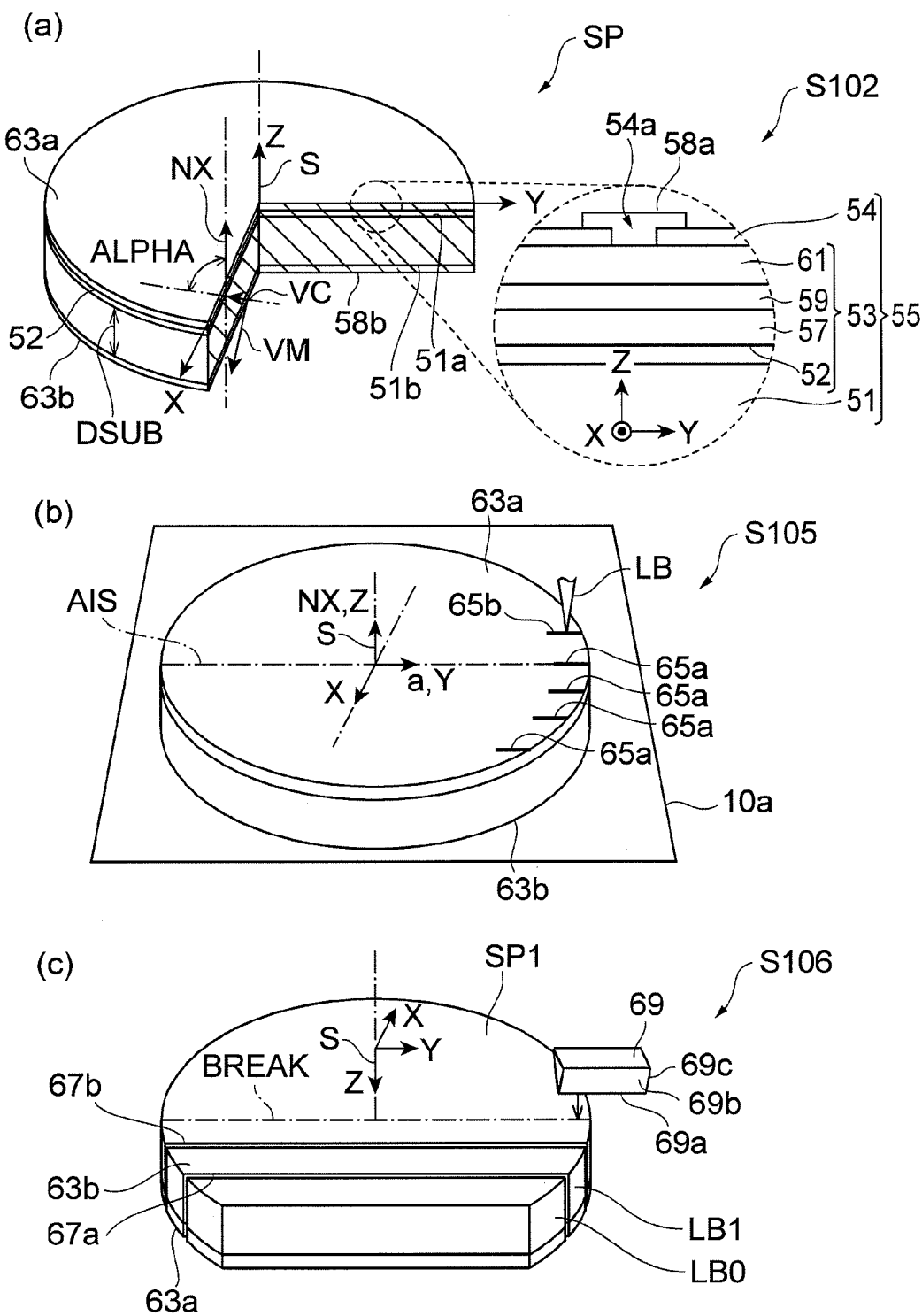
FIG. 6 is a drawing schematically showing major steps in the method for fabricating the Group III nitride semiconductor laser device according to the embodiment.

The semiconductor region 53, as shown in part (a) of FIG. 6, includes an InGaN layer 52 to define the position where a step is to be formed in an end face of a laser bar. In an example, the semiconductor region 53 can be formed so that the InGaN layer 52 is disposed between the substrate 51 and the light emitting layer 59. In this case, the position of the InGaN layer 52 can be located away from the light emitting layer 59. In another example, the semiconductor region 53 can be formed so that the light emitting layer 59 is disposed between the substrate 51 and the InGaN layer 52. In this case, the position of the InGaN layer 52 can be located away from the light emitting layer 59. Accordingly, the addition of the InGaN layer 52 does not affect the crystal quality in growth of an epitaxial film such as the light emitting layer 59 grown on the substrate 51. In still another example, the semiconductor region 53 can be formed so that the InGaN layer 52 corresponds to an InGaN well layer of the light emitting layer 59. In this case, the well layer for emission of relatively long wavelength can also serve as an InGaN layer for creation of the step 26. If needed, the InGaN layer 52 can be located in the second conductivity type gallium nitride semiconductor region 61 and/or in the gallium nitride semiconductor region 57.

In Step S104, an anode electrode 58a is formed, which extends in the direction of the waveguide axis, and a cathode electrode 58b is formed on the laser structure 55. Before the electrode is formed on the back surface of the substrate 51, the back surface of the substrate used for crystal growth is polished to form a substrate product SP with the desired thickness DSUB. In the electrode formation, for example, the anode electrode 58a is formed on the semiconductor region 53 and the cathode electrode 58b is formed on the back surface (polished surface) 51b of the Group III nitride substrate 51. The anode electrode 58a extends in the X-axis direction, and the cathode electrode 58b covers almost the entire area of the back surface 51b. These fabrication steps result in forming the substrate product SP. The substrate product SP includes a first face 63a and a second face 63b which is located on the opposite side thereto. The semiconductor region 53 is located between the first face 63a and the Group III nitride substrate 51.

In Step S105, as shown in part (b) of FIG. 6, the first face 63a of the substrate product SP is scribed therein. This scribing step is carried out in the projection direction of the c-axis of the hexagonal Group III nitride semiconductor onto the semipolar primary surface. This scribing step is carried out using a laser scriber 10a. The scribing step results in forming scribed grooves 65a. The scribed grooves 65a extend along a plane defined by the direction intersecting with the waveguide axis and a direction of a normal to the primary surface of the substrate 51. In part (b) of FIG. 6, five scribed grooves are already formed and a scribed groove 65b is being formed with a laser beam LB. The length of the scribed grooves 65a is defined along an a-n plane which is defined by the a-axis of the hexagonal Group III nitride semiconductor and the normal axis NX, and is smaller than the length of an intersecting line MS between the a-n plane and the first face 63a, and the laser beam LB is applied to a part of the intersecting line MS. With application of the laser beam LB, the grooves extending in the specific direction and reaching the semiconductor region are formed in the first face 63a. The scribed grooves 65a can be formed, for example, at one edge of the substrate product SP. The scribed grooves 65a extend in a cleaving direction of the support substrate.

In Step S106, as shown in part (c) of FIG. 6, the substrate product SP is broken by press against the second face 63b of the substrate product SP to form a substrate product SP1 and a laser bar LB1. The press is carried out, for example, using a breaking device such as a blade 69. The blade 69 includes an edge 69a extending in one direction, and at least two blade faces 69b and 69c defining the edge 69a. The edge of the breaking device is pressed on the substrate product SP1 from a direction intersecting with the second face 63b. The intersecting direction is preferably a direction substantially perpendicular to the second face 63b. This step results in breaking the substrate product SP to form the substrate product SP1 and the laser bar LB1. The laser bar LB1 with first and second end faces 67a and 67b is formed by the press, and these end faces 67a and 67b, at least in a part of the light emitting layer, have perpendicularity and flatness enough to be applied to the cavity mirrors of the semiconductor laser.

According to this method, the first face 63a of the substrate product SP is scribed in the direction of the a-axis of the hexagonal Group III nitride semiconductor, and thereafter the substrate product SP is broken by the press against the second face 63b of the substrate product SP to form the new substrate product SP1 and the laser bar LB1. For this reason, the first and second end faces 67a and 67b are formed in the laser bar LB1 so as to intersect with an m-n plane. This end face formation provides the first and second end faces 67a and 67b with the flatness and perpendicularity enough to construct the laser cavity of the Group III nitride semiconductor laser device.

In this method, the laser waveguide thus formed extends in the direction of inclination of the c-axis of the hexagonal Group III nitride. The end faces of cavity mirrors that can provide this laser waveguide are formed without use of dry-etched surfaces.

In this method, the new substrate product SP1 and the laser bar LB1 are formed by breaking of the substrate product SP1. In Step S107, the breaking is repeatedly carried out by press to produce many laser bars. This fracture is induced using the scribed grooves 65a shorter than a break line BREAK of the laser bar LB1.

The below will describe a method for forming a laser bar by fracture. The step that forms a difference in height at the position of the InGaN layer 52 can be controlled by conditions for the In composition and thickness of InGaN and scribing conditions.

The fabricating method to be adopted can be, for example, one of below-described methods. In FIG. 7, an actual fractured line 48 and an ideal fractured line 46 are shown. In the case of a substrate product in which in the semiconductor region 53 an InGaN layer 52a is located between the well layer in the light emitting layer 59 and the substrate 51 (or in which the InGaN layer 52a is located closer to the substrate than to the well layer), as shown in part (a) of FIG. 7, the scribing can be carried out onto the second face 63b (the back of the substrate 51) and the press with the blade 65 can be carried out onto the first face 63a (epitaxial surface). Corresponding to the position of the InGaN layer 52a, a step 54a is formed in the area between the well layer and the substrate 51 in a fractured face. According to careful observation by the inventors, when the well layer includes an InGaN layer with a large indium composition, a step forming a difference in level is also formed at this well layer, but the width of the step in the well layer is smaller than in the case not including the InGaN layer 52a. In this example the scribing can be carried out onto the first face 63a (epitaxial surface) and the press with the blade 65 onto the second face 63b (the back of the substrate 51). In this case, the step 54a is also formed in the area of the fractured face between the well layer and the substrate 51, in association with the position of the InGaN layer 52a.

In another fabricating method, where the substrate product is one in which in the semiconductor region 53 the well layer of the light emitting layer 59 is located between an InGaN layer 52b and the substrate 51 (or in which the InGaN layer 52b is located above the well layer), as shown in part (b) of FIG. 7, the scribing can be carried out onto the first face 63a (epitaxial surface) and the press with the blade 65 can be carried out onto the second face 63b (the back of the substrate 51). A step 54b is formed in the area between the well layer and the substrate 51 in a fractured face, in association with the position of the InGaN layer 52b.

In still another fabricating method, where the substrate product is one in which in the semiconductor region 53 the well layer of the light emitting layer 59 includes an InGaN layer 52c (or in which the InGaN layer 52c is located in the well layer), as shown in part (c) of FIG. 7, the scribing can be carried out onto the first face 63a (epitaxial surface) and the press with the blade 65 onto the second face 63b (the back of the substrate 51). A step 54c is formed at the position of the InGaN layer 52c. Influence on propagating light is insignificant as long as the step 54c is not more than 180 nm. The step 54c is more preferably not more than 80 nm with an effect of reduction in occurrence of abnormality of end-face coating. In this example, the In composition and thickness of the InGaN well layer are determined in association with the aimed lasing wavelength, and thus the formation of the step 54c is preferably controlled by the scribing conditions.

The laser bar LB1 thus formed has the first and second end faces 67a, 67b formed by the above-described breaking and each of the end faces 67a, 67b extends from the first face 63a to the second face 63b. For this reason, the end faces 67a, 67b constitute a laser cavity of the Group III nitride semiconductor laser device and intersect with the XZ plane. This XZ plane is associated with the m-n plane defined by the m-axis of the hexagonal Group III nitride semiconductor and the normal axis NX.

According to these fabricating methods, the semiconductor region 53 includes the InGaN layer 52a-52c and the laser bar LB0, LB1 is formed by breaking. The InGaN layer 52a-52c is formed in the semiconductor region 53 and the level step 54a-54c is formed at the end faces 67a, 67b of the InGaN layer 52a-52c, during production of the end faces by breaking. This step 54a-54c is formed in part or in whole of the end faces 67a, 67b of the laser bar, and extends in the direction from one side face to the other side face of the end faces 67a, 67b of the laser bar. The extension of this step 54a-54c can guide the direction of propagation of the end face forming, and the variation of perpendicularity required of the end faces 67a, 67b for the optical cavity in distribution can be made smaller in production of many Group III nitride semiconductor laser devices.

In Step S108, dielectric multilayer films are formed on the end faces 67a, 67b of the laser bar LB1, thereby forming a laser bar product. In Step S109, this laser bar product is broken into chips of individual semiconductor lasers.

In the fabricating method according to the present embodiment, the angle ALPHA can be in the range of not less than 45 degrees and not more than 80 degrees or in the range of not less than 100 degrees and not more than 135 degrees. If the angle is less than 45 degrees or more than 135 degrees, the end faces formed by press become highly likely to be comprised of m-planes. When the angle is more than 80 degrees and less than 100 degrees, there is a possibility of failure in achievement of desired flatness and perpendicularity. More preferably, the angle ALPHA can be in the range of not less than 63 degrees and not more than 80 degrees or in the range of not less than 100 degrees and not more than 117 degrees. In this angle range the piezoelectric polarization can be made small in the active layer. Since In incorporation is large in growth of the active layer, the variable range of In composition is wide in the active layer. For this reason, the foregoing range is suitable for obtaining emission of long wavelength. Since In incorporation is large, it is suitable for formation of the InGaN layer 24. The semipolar primary surface 51a can be any one of a {20-21} plane, a {10-11} plane, a {20-2-1} plane, and a {10-1-1} plane. Furthermore, a plane slightly inclined in the range of not less than −4 degrees and not more than +4 degrees away from these planes is also suitably applicable to the primary surface. With these typical semipolar planes, it is feasible to provide the end faces for the laser cavity with flatness and perpendicularity enough to construct the laser cavity of the Group III nitride semiconductor laser device.

The substrate 51 can be comprised of any one of GaN, AlN, AlGaN, InGaN, and InAlGaN. When the substrate comprises any one of these gallium nitride semiconductors, we can obtain the end faces applicable to the laser cavity. The substrate 51 is preferably made of GaN.

In the step S104 of forming the substrate product SP, in order to obtain the semiconductor substrate used in crystal growth, the substrate is processed by slicing or cutting into the substrate thickness of not more than 400 μm and the second face 63b is polished to form a processed surface. In this substrate thickness, it is feasible to form the end faces 67a, 67b, having flatness and perpendicularity enough to construct the laser cavity of the Group III nitride semiconductor laser device, with an excellent yield. In a further preferred configuration the second face 63b is a polished surface formed by polishing, and the substrate thickness after polishing is not more than 100 μm. For relatively readily handling the substrate product SP, the substrate thickness is preferably not less than 50 μm.

In the fabricating method of laser end faces according to the present embodiment, the angle BETA described with reference to FIG. 3 is also defined in the laser bar LB1. In the laser bar LB1, the component (BETA)$_1$ of the angle BETA is preferably in the range of not less than (ALPHA−5) degrees and not more than (ALPHA+5) degrees in a first plane defined by the c-axis and m-axis of the Group III nitride semiconductor (a plane corresponding to the first plane S1 in the description with reference to FIG. 3). The end faces 67a, 67b of the laser bar LB1 satisfy the aforementioned perpendicularity as to the angle component of the angle BETA taken from one to the other of the c-axis and m-axis. The component (BETA)$_2$ of the angle BETA is preferably in the range of not less than −5 degrees and not more than +5 degrees in a second plane (a plane corresponding to the second plane S2 shown in FIG. 3). In this case, the end faces 67a, 67b of the laser bar LB1 satisfy the aforementioned perpendicularity as to the angle component of the angle BETA defined in the plane perpendicular to the axis NX normal to the semipolar surface 51a.

The end faces 67a, 67b are formed by breaking by press on the plurality of gallium nitride semiconductor layers epitaxially grown on the semipolar surface 51a. Since the layers correspond to the epitaxial films grown on the semipolar surface 51a, the end faces of the semiconductor region 53 in the end faces 67a, 67b are not cleaved facets with a low plane index such as c-planes, m-planes, or a-planes having been used heretofore as cavity mirrors. In breaking the lamination of epitaxial films formed on the semipolar surface 51a, however, the end faces 67a, 67b have the flatness and perpendicularity applicable to the cavity mirrors.

Example 1

As described below, a semipolar plane GaN substrate is prepared and the perpendicularity of fractured faces thereof is observed. The substrate used is a {20-21}-plane GaN substrate cut out at the angle of 75 degrees toward the m-axis direction from a (0001) GaN ingot thickly grown by the HVPE process. The primary surface of the GaN substrate is mirror polished, and the back surface is in a pearskin finish state by grinding. The thickness of the substrate was 370 μm.

Epitaxial layers are grown on the primary surface of the substrate and the back surface is polished to the thickness of 80 μm The epitaxial surface is scribed with a laser scriber to form scribed grooves extending perpendicularly to the direction defined by the c-axis projected onto the primary surface of the substrate, and thereafter the substrate is fractured by press on the back surface of the substrate. For observing the perpendicularity of the resulting fractured face, the substrate is observed from the a-plane direction with a scanning electron microscope.

Part (a) of FIG. 8 shows a scanning electron microscope image obtained by observing the fractured face seen from the a-plane direction, in which the right end face is the fractured face. It is seen that the fractured face has flatness and perpendicularity to the semipolar primary surface and a step with difference in level is formed.

For checking the availability as a cavity of a laser with this end face, laser diodes are grown by the metal organic vapor phase epitaxial process as in the examples below. Raw materials used are trimethylgallium (TMGa), trimethylaluminum (TMAl), trimethylindium (TMIn), ammonia (NH$_3$), silane (SiH$_4$), and bis(cyclopentadienyl)magnesium (Cp$_2$Mg). A GaN substrate is prepared. This GaN substrate is prepared as a GaN substrate with the inclination angle ALPHA of the c-axis toward the m-axis direction being a desired off-axis angle in the range of 0 degrees to 90 degrees, by cutting out the substrate with a wafer slicing device at the angle in the range of 0 degrees to 90 degrees toward the m-axis direction from a (0001) GaN ingot thickly grown by the HYPE process. For example, when the substrate is fabricated by cut-out at the angle of 75 degrees, the resultant substrate is a {20-21}-plane GaN substrate and is represented by reference sign 71a in a hexagonal crystal lattice shown in part (b) of FIG. 8. Part (c) of FIG. 8 shows a configuration in which a laser stripe is provided to extend in the <11-20> direction, and shows end faces 81c, 81d for a laser cavity along with a semipolar plane 71a. The end faces 81c and 81d are approximately perpendicular to the semipolar plane 71a and are comprised of a-planes.

Example 2

A laser diode DEV1 shown in part (a) of FIG. 9 is fabricated. For producing an LD structure of the 520 nm lasing wavelength band, a (20-21)-plane GaN substrate corresponding to m 75 degrees off is prepared. A pretreatment (thermal cleaning) is carried out by maintaining the GaN substrate under the conditions of an atmosphere containing ammonia and hydrogen, the substrate temperature of 1050 degrees Celsius, and a duration of ten minutes. After this, an n-type GaN layer is grown at the substrate temperature of 1050 degrees Celsius on the GaN substrate. The substrate temperature is decreased to 840 degrees Celsius and thereafter an n-type InAlGaN (In composition: 0.02, Al composition: 0.09)

cladding layer is grown on the GaN substrate. The thickness of the cladding layer is 1.5 μm. An InGaN optical guiding layer (In composition: 0.03) is grown on the cladding layer. A multiple quantum well light emitting layer is grown on the optical guiding layer. The thickness of InGaN well layers is 3 nm and the In composition thereof is 0.30. The thickness of GaN barrier layers is 15 nm. The growth temperature of the well layers was 740 degrees Celsius and the growth temperature of the barrier layers 840° C. An InGaN optical guiding layer (In composition: 0.03) is grown at the substrate temperature of 840 degrees Celsius on the multiple quantum well light emitting layer. After this, the substrate temperature is raised to 1000 degrees Celsius, and a p-type AlGaN electron block layer (Al composition: 0.12) is grown. The substrate temperature is decreased to 840 degrees Celsius and thereafter a p-type InAlGaN (In composition: 0.02, Al composition: 0.09) cladding layer is grown. A p-type GaN contact layer is grown thereon, thereby completing an epitaxial semiconductor region.

An insulating film such as $SiO_2$ is deposited, and thereafter a stripe window with the width of 10 μm is formed in this insulating film by wet etching. The waveguide direction defined by the direction of the stripe window is defined along the off direction of the c-axis.

A p-side electrode comprising Ni/Au and a pad electrode comprising Ti/Au are formed by evaporation. After polishing the back surface of the substrate, an n-side electrode comprising Ti/Al and a pad electrode comprising Ti/Au are formed by evaporation. The substrate is broken at intervals of 800 μm to form end faces (fractured faces). A dielectric multilayer film comprising $SiO_2/TiO_2$ is formed on each of the end faces. A gain-guiding type laser is fabricated through these steps. The formation of end faces is carried out as described below. Scribed grooves are formed with a laser scriber on a surface of the epitaxial semiconductor region (epitaxial surface), and thereafter a blade is pressed against the back surface of the substrate, using a breaker.

For comparison, a laser diode of the 400 nm wavelength band with the In composition of the InGaN well layers of 0.07 is fabricated on a (20-21)-plane GaN substrate. The growth temperature of the InGaN well layers is 840 degrees Celsius.

In the end faces of the laser diode fabricated under the conditions of Example 2, steps are observed at the positions of the end faces of the InGaN well layer by observation with a scanning electron microscope (SEM). According to observation with a transmission electron microscope (TEM), the width of the steps is approximately 15 nm-60 nm. When the chip surface is observed with an optical microscope, the angular variation VAR shown in part (b) of FIG. 9 is in the range of 0 degrees to 1.5 degrees inclusive.

In the end faces of the laser diode fabricated under the conditions of the comparative example, no step is observed by observation with a scanning electron microscope (SEM). The angular variation shown in part (b) of FIG. 9 is distributed, and a ratio of angles in the range of 0 degrees to 1.5 degrees inclusive is approximately 10% of the total number, which is lower than the value in the example.

In the laser diode fabricated under the conditions of the example, the indium composition of the well layers is high and, for this reason, large strain is incorporated in the InGaN well layers. It is considered that a step is formed from a starting point of highly strained InGaN, and deviation from a scribe line is suppressed as to a progressing direction of fracture.

Example 3

Figure 10:
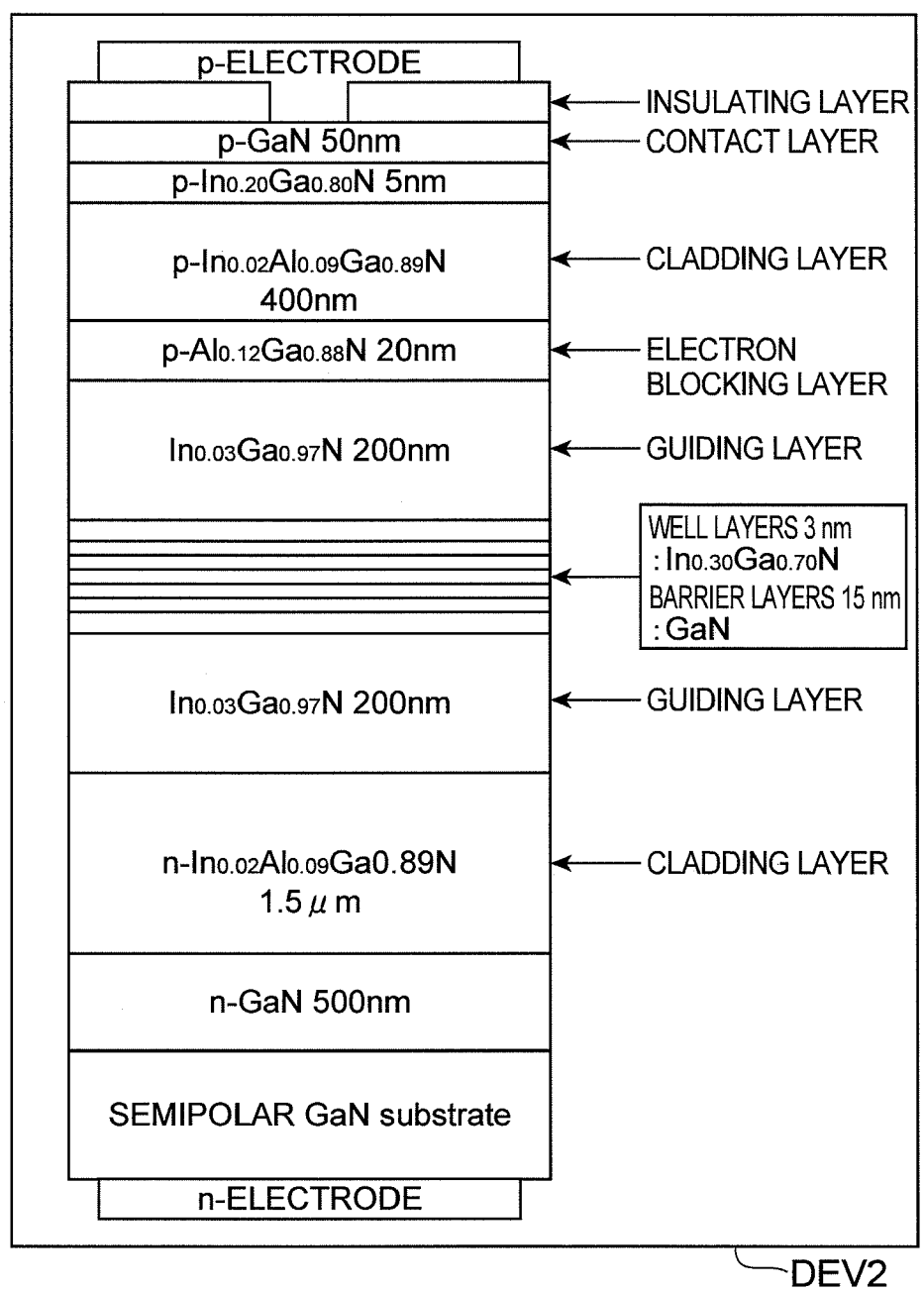
FIG. 10 is a drawing showing a device structure and an epitaxial structure in Example 1.

A laser diode DEV2 shown in FIG. 10 is fabricated. A p-type InGaN layer (In composition: 0.20) is formed so as to be located between the p-type cladding layer and the p-type contact layer in Example 2. The thickness of this p-type InGaN layer is 5 nm. The growth temperature of the p-type InGaN layer is 860 degrees Celsius.

For forming the end faces, scribed grooves are formed with a laser scriber on the epitaxial surface, and a blade is pressed against the back surface of the substrate with a breaker.

In the end faces of the laser diode fabricated under the conditions of Example 3, steps are observed at the positions of the end faces of the p-type InGaN layer, by observation with a scanning electron microscope (SEM). Steps are also observed near the light emitting layer. According to observation with a transmission electron microscope (TEM), the steps near the light emitting layer have the width of about 0 nm to 30 nm. The width tends to decrease from the values in Example 2. A conceivable reason for it is that since the fracture in formation of the end face progresses from the epitaxial surface, the shape in fracture near the light emitting layer becomes closer to the ideal fracture direction because of the step formed in the p-type InGaN layer.

When the laser diodes fabricated under the conditions of Example 2 and Example 3 are pulse-energized with the pulse width of 500 nsec and the duty of 0.1%, their threshold currents both are about 800 mA and no significant difference is recognized in initial properties. A conceivable reason for it is that since the width of the steps is sufficiently smaller than the wavelength in the semiconductor region, an adverse effect on amplification of light is insignificant. A further conceivable reason is that, concerning the laser diode fabricated under the conditions of Example 3, since the location of the p-type InGaN layer is outside the p-type cladding layer, an adverse effect on electric field distribution in the waveguide is also insignificant.

When long-term energization tests are conducted with the laser diodes fabricated under the conditions of Example 2 and Example 3, the laser diode fabricated under the conditions of Example 3 is superior. A conceivable reason for it is that since there are plural steps formed in Example 3, restriction on the end-face coat is smaller.

Example 4

Figure 11:
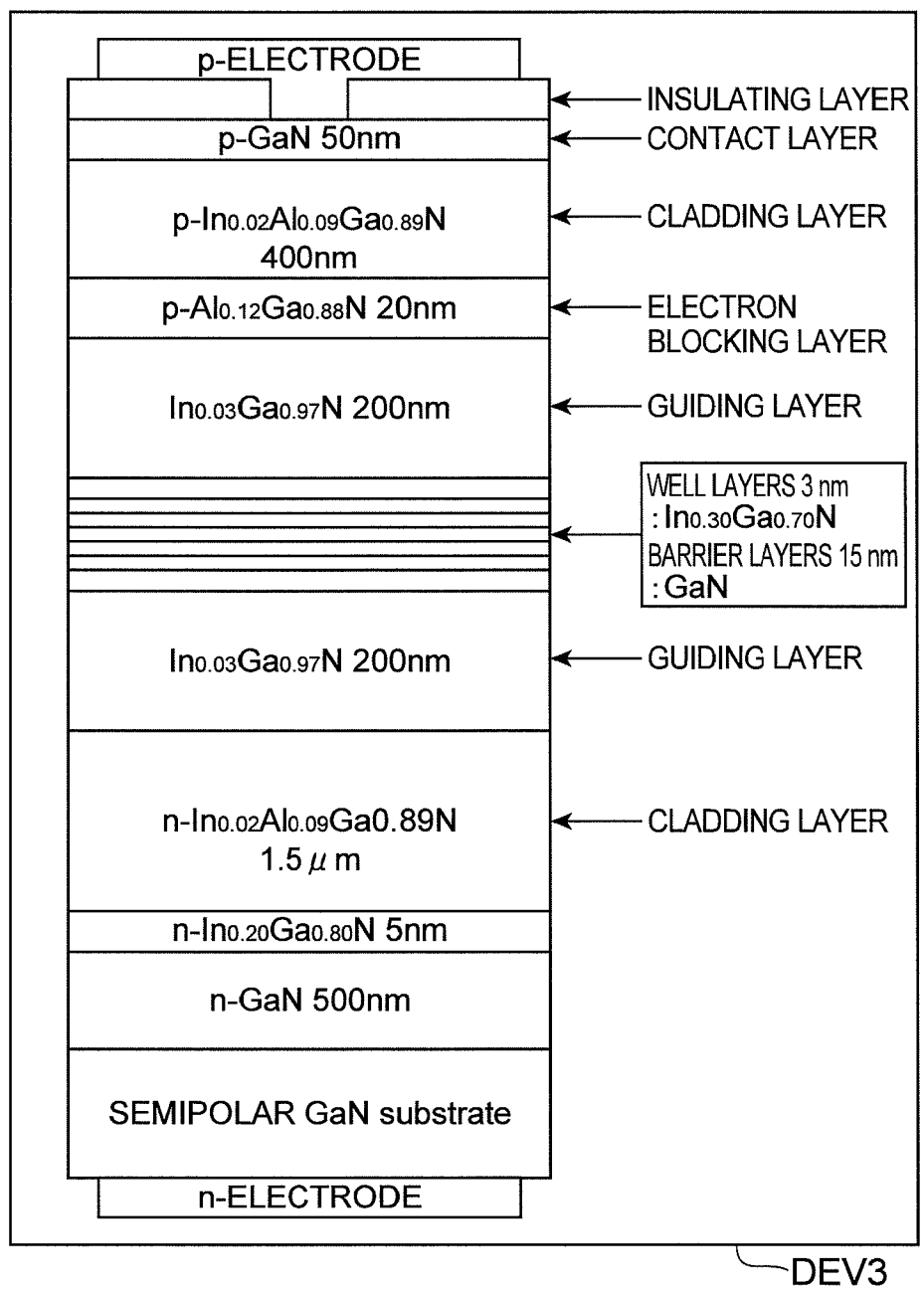
FIG. 11 is a drawing showing a device structure and an epitaxial structure in Example 1.

A laser diode DEV3 shown in FIG. 11 is fabricated. An n-type InGaN layer (In composition: 0.20) is formed so as to be located between the p-type cladding layer and the n-type GaN layer in Example 2. The thickness of this n-type InGaN layer is 5 nm. The growth temperature of the n-type InGaN layer is 860 degrees Celsius.

For forming the end faces, scribed grooves are formed with a laser scriber on the epitaxial surface and thereafter a blade is pressed against the back surface of the substrate with a breaker (method 1). Furthermore, after the scribed grooves are formed with a laser scriber on the back surface of the substrate, a blade is pressed against the back surface of the substrate with a breaker (method 2).

In the end faces of the laser diodes fabricated under the conditions of these methods, steps are observed at the positions of the end faces of the n-type InGaN layer, by observation with a scanning electron microscope (SEM). Furthermore, steps are also observed near the light emitting layer. The width of the steps in fabrication of method 1 is larger than that of the steps in fabrication of method 2. The steps in the light emitting layer tend to be smaller in the end faces fabricated by method 2. A conceivable reason for it is that in method 2, the light emitting layer is broken after the n-type InGaN layer. In either of the two methods, the steps in the light emitting layer are smaller than those in the case without the n-type InGaN layer. The laser properties of the laser diode fabricated under the conditions of method 2 are approximately equivalent to those of the laser diode fabricated under the conditions of Example 3.

Figure 12:
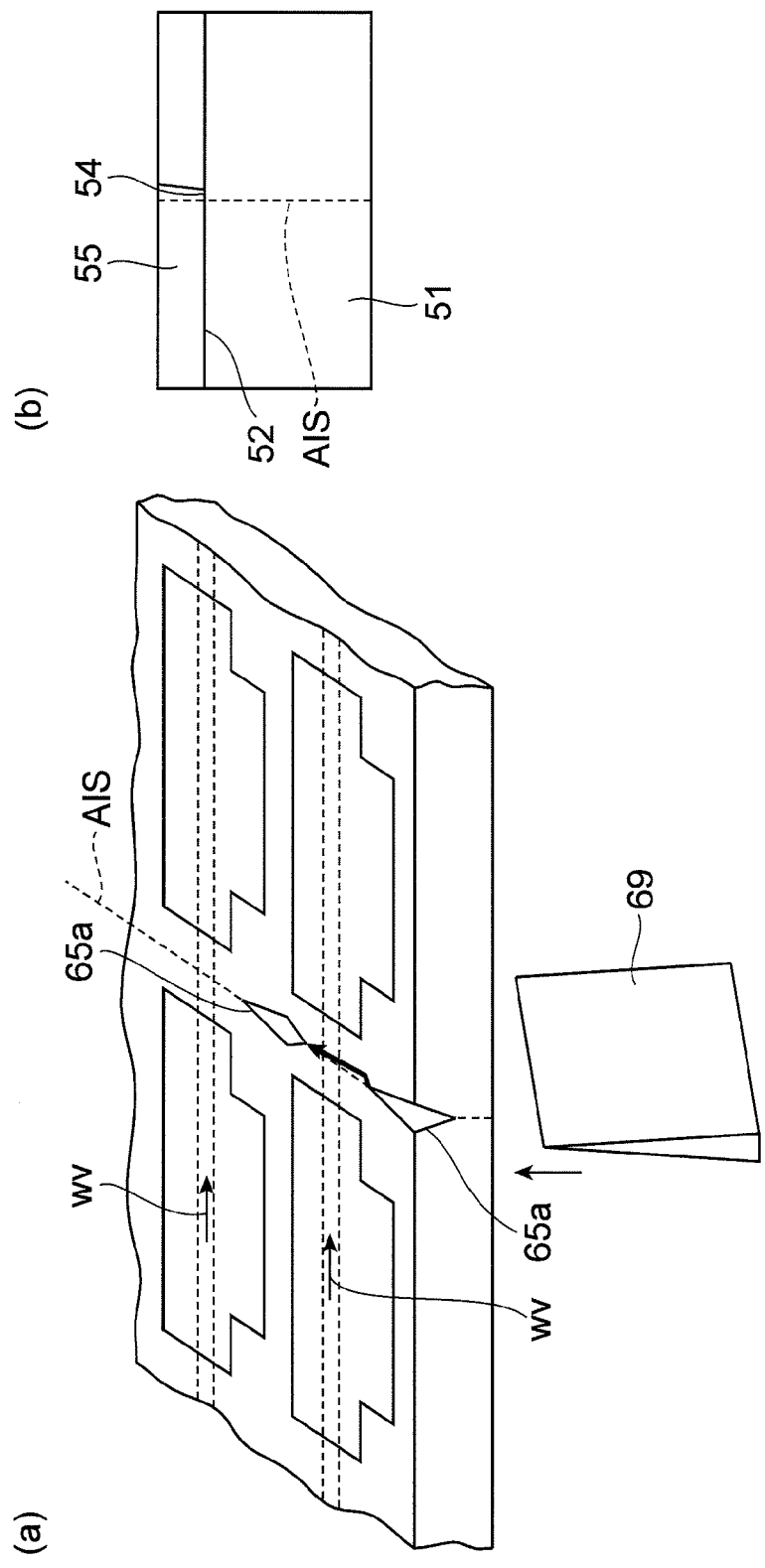
FIG. 12 is a drawing schematically showing a substrate product including an InGaN layer.

The present embodiment will be described with reference to FIGS. 12 and 13. Part (a) of FIG. 12 is a drawing schematically showing a substrate product, and part (b) of FIG. 12 is a drawing showing a side face in the substrate product. As shown in FIG. 12, the semiconductor region 55 includes the InGaN layer 52 as described above. Since the InGaN layer 52 includes built-in strain, the step 54 is formed at the obtained end face during formation of the end face. This step can reduce expansion of deviation between the actual fractured line and the AIS line, thereby increasing the lasing yield.

Figure 13:
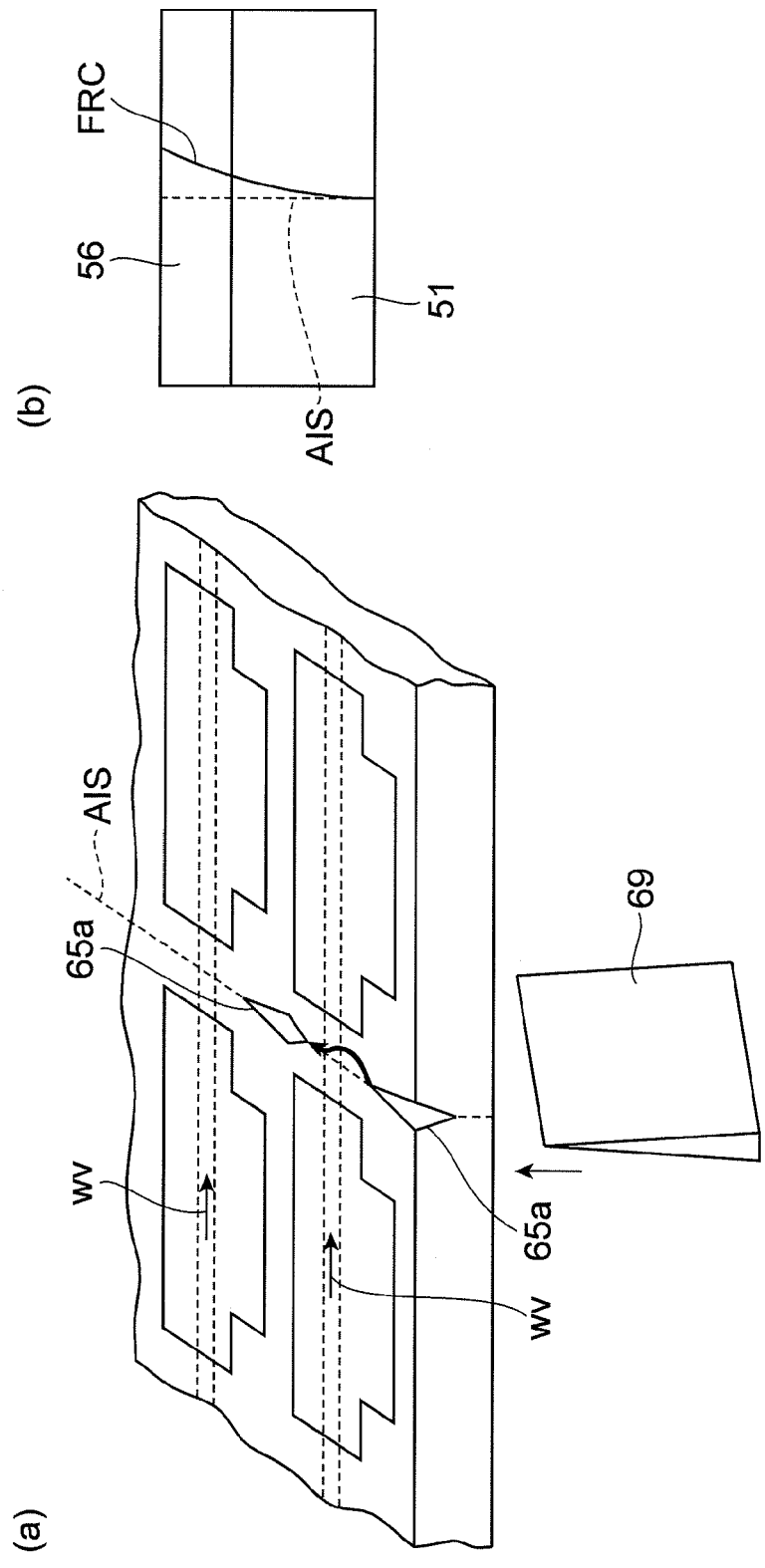
FIG. 13 is a drawing schematically showing a substrate product including no InGaN layer.

Part (a) of FIG. 13 is a drawing schematically showing a substrate product, and part (b) of FIG. 13 is a drawing showing a side face in the substrate product. As shown in FIG. 13, the semiconductor region 56 does not include the InGaN layer 52 as provided in the semiconductor region 55. Since the blade 69 defines a starting point of fracture FRC in the surface in contact with the blade 69, the fracture progresses relatively straight. On the other hand, the fracture deviates from the AIS line in the surface in which the scribed grooves 65a are formed. Once the fracture deviates, the deviation increases with progress of fracture and then the fracture returns to the AIS line around the next scribed groove 65a. Semipolar GaN has optical anisotropy, and a large optical gain is achieved by forming the waveguide in the direction indicated by the c-axis projected onto the primary surface. In this structure, the end faces for the optical cavity are not cleaved facets. For this reason, it is more difficult to obtain an excellent perpendicularity of the end faces with respect to the waveguide, when compared to the cleaved facets.

It was confirmed by various experiments including the above examples that the angle ALPHA is preferably in the range of not less than 45 degrees and not more than 80 degrees or in the range of not less than 100 degrees and not more than 135 degrees.

For enhancing the lasing chip yield, the angle ALPHA to define the inclination of the c-axis toward the m-axis direction can be in the range of not less than 63 degrees and not more than 80 degrees or in the range of not less than 100 degrees and not more than 117 degrees. A typical semipolar primary surface can be any one of a {20-21} plane, a {10-11} plane, a {20-2-1} plane, and a {10-1-1} plane. Further, it can be a plane slightly inclined from these semipolar planes. For example, the semipolar primary surface can be a plane slightly inclined off in the range of not less than −4 degrees and not more than +4 degrees toward the m-plane direction away from any one of the {20-21} plane, the {10-11} plane, the {20-2-1} plane, and the {10-1-1} plane. A conceivably possible reason why the fractured faces relatively perpendicular to the grown surface are obtained is that neutral atomic arrangements in terms of charge appear periodically to make generation of fractured faces relatively stable.

As described above, the embodiments of the present invention provide the Group III nitride semiconductor laser device having the structure that can improve the lasing yield. The embodiments of the present invention also provide the method for fabricating the Group III nitride semiconductor laser device that can improve the lasing yield.

Having illustrated and described the principle of the present invention in the preferred embodiments thereof, but it should be noted that it can be understood by those skilled in the art that the present invention can be modified in arrangement and detail without departing from the principle of the invention. The present invention is by no means limited to the specific configurations disclosed in the embodiments thereof. Therefore, we claim all corrections and modifications resulting from the scope and spirit of claims.

What is claimed is:

1. A Group III nitride semiconductor laser device comprising:
   a laser structure including a support substrate and a semiconductor region, the support substrate having a semipolar primary surface comprised of a hexagonal Group III nitride semiconductor, and the semiconductor region being provided on the semipolar primary surface of the support substrate; and
   an electrode extending in a direction of a waveguide axis indicative of a direction of a waveguide in the Group III nitride semiconductor laser device, the electrode being provided on the semiconductor region,
   the semiconductor region having a first gallium nitride based semiconductor layer, a second gallium nitride based semiconductor layer and an active layer, the active layer being provided along a normal axis to the semipolar primary surface,
   the first gallium nitride based semiconductor layer having a first conductivity type,
   the second gallium nitride based semiconductor layer having a second conductivity type,
   the c-axis of the hexagonal Group III nitride semiconductor of the support substrate being inclined at an angle ALPHA relative to the normal axis toward the direction of the waveguide axis,
   the laser structure including first and second fractured faces, the first and second fractured faces intersecting with the waveguide axis,
   a laser cavity of the Group III nitride semiconductor laser device including the first and second fractured faces,
   an end face of the support substrate and an end face of the semiconductor region being exposed in each of the first and second fractured faces,
   the laser structure including first and second faces, and the first face being a face opposite to the second face,
   each of the first and second fractured faces extending from an edge of the first face to an edge of the second face,
   the semiconductor region including an InGaN layer,
   the first fractured face including a step defined by an end face of the InGaN layer, wherein a normal axis of the step defined by the end face of the InGaN layer is not orthogonal to the normal axis of the semipolar primary surface, and
   the step defined by the end face of the InGaN layer extending in a direction from one side face to the other side face of the Group III nitride semiconductor laser device.

2. The Group III nitride semiconductor laser device according to claim 1, wherein a width of the step is not more than 180 nm, and
   wherein the width of the step is defined in the direction of the waveguide axis.

3. The Group III nitride semiconductor laser device according to claim 1,
   wherein the angle between the normal axis and the c-axis of the hexagonal Group III nitride semiconductor is in a range of not less than 45 degrees and not more than 80 degrees or in a range of not less than 100 degrees and not more than 135 degrees.

4. The Group III nitride semiconductor laser device according to claim 1,
wherein an indium composition of the InGaN layer is not less than 0.10 and not more than 0.50.

5. The Group III nitride semiconductor laser device according to claim 1,
wherein a thickness of the InGaN layer is not less than 1 nm and not more than 10 nm.

6. The Group III nitride semiconductor laser device according to claim 1, further comprising:
a dielectric multilayer film provided on the first fractured face,
wherein a width of the step is not more than 80 nm.

7. The Group III nitride semiconductor laser device according to claim 1,
wherein the c-axis of the Group III nitride semiconductor is perpendicular to a reference axis in a first plane defined by the c-axis of the Group III nitride semiconductor and the waveguide axis, and
wherein an angle between an end face for output of light in the semiconductor region and a reference plane perpendicular to the reference axis is in a range of not less than −5 degrees and not more than +5 degrees in a second plane perpendicular to both of the first plane and the normal axis.

8. The Group III nitride semiconductor laser device according to claim 1,
wherein the c-axis of the Group III nitride semiconductor is perpendicular to a reference axis in a first plane defined by both of the c-axis of the Group III nitride semiconductor and the waveguide axis, and
wherein an angle between an end face for output of light in the semiconductor region and a reference plane perpendicular to the reference axis is an angle in the range of not less than (ALPHA−5) degrees and not more than (ALPHA+5) degrees in the first plane.

9. The Group III nitride semiconductor laser device according to claim 1,
wherein the InGaN layer is provided between the support substrate and the active layer.

10. The Group III nitride semiconductor laser device according to claim 1,
wherein the active layer is provided between the support substrate and the InGaN layer.

11. The Group III nitride semiconductor laser device according to claim 1,
wherein the InGaN layer is an InGaN well layer of the active layer.

12. The Group III nitride semiconductor laser device according to claim 1,
wherein the angle between the normal axis and the c-axis of the hexagonal Group III nitride semiconductor is in the range of not less than 63 degrees and not more than 80 degrees or in the range of not less than 100 degrees and not more than 117 degrees, and
wherein the c-axis of the hexagonal Group III nitride semiconductor of the support substrate is inclined toward a direction of the m-axis of the hexagonal Group III nitride semiconductor.

13. The Group III nitride semiconductor laser device according to claim 1,
wherein the semipolar primary surface is a plane inclined off in the range of not less than −4 degrees and not more than +4 degrees from any one of a {20-21} plane, a {10-11} plane, a {20-2-1} plane, and a {10-1-1} plane.

14. The Group III nitride semiconductor laser device according to claim 1,
wherein the semipolar primary surface is any one of a {20-21} plane, a {10-11} plane, a {20-2-1} plane, and a {10-1-1} plane.

15. The Group III nitride semiconductor laser device according to claim 1,
wherein the active layer includes a light emitting region provided so as to generate light at the wavelength of not less than 480 nm and not more than 550 nm.

* * * * *